United States Patent [19]
Kato et al.

[11] Patent Number: 6,049,372
[45] Date of Patent: *Apr. 11, 2000

[54] EXPOSURE APPARATUS

[75] Inventors: Kinya Kato; Hiroshi Shirasu; Yukio Kakizaki; Kei Nara, all of Yokohama, Japan

[73] Assignee: Nikon Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/881,902

[22] Filed: Jun. 23, 1997

[30] Foreign Application Priority Data

| Jun. 25, 1996 | [JP] | Japan | 8-184112 |
| Jun. 25, 1996 | [JP] | Japan | 8-184113 |
| Apr. 30, 1997 | [JP] | Japan | 9-126308 |
| Apr. 30, 1997 | [JP] | Japan | 9-126309 |

[51] Int. Cl.$^7$ .................................................. G03B 27/42
[52] U.S. Cl. .......................... 355/53; 356/400; 356/401
[58] Field of Search ................................ 355/53; 356/399, 356/400, 401, 363; 250/491.1, 492.2

[56] References Cited

U.S. PATENT DOCUMENTS

| 5,523,574 | 6/1996 | Hamada et al. . |
| 5,581,075 | 12/1996 | Naraki et al. . |
| 5,729,331 | 3/1998 | Tanaka et al. ............................ 355/53 |
| 5,798,822 | 8/1998 | Miyazaki et al. .......................... 355/53 |

FOREIGN PATENT DOCUMENTS 7-57986  3/1995  Japan.

*Primary Examiner*—Alan A. Mathews
*Attorney, Agent, or Firm*—Klarquist Sparkman Campbell Leigh & Whinston, LLP

[57] ABSTRACT

Apparatus and methods are disclosed for transferring a pattern defined by a mask onto a surface of a substrate. The apparatus includes an illumination optical system for illuminating the pattern on the mask. A projection optical system forms an erect image of the pattern on the substrate. For exposure, the mask and substrate are movable together in a scanning direction relative to the projection optical system. First and second relative-displacement measuring systems, the first being separated from the second by a predetermined distance perpendicular to the scanning direction, measure displacement of the mask relative to the substrate in the scanning direction. First and second detection systems detect displacement of the mask and substrate, respectively, in the direction perpendicular to the scanning direction. A position-adjusting system adjusts the position of at least one of the mask and substrate. A calculation system calculates a position-adjusting amount based on outputs from the first and second relative-displacement measuring systems and from the first and second detection systems. A control system controls the position-adjusting system based on an output from the calculation system.

37 Claims, 9 Drawing Sheets

EXPOSURE APPARATUS

FIELD OF THE INVENTION

This invention relates to a projection-exposure apparatus particularly as used in microlithography. More specifically, the invention relates to scanning-type projection-exposure apparatus as used for manufacturing, for example, semiconductor integrated circuits, liquid-crystal display panels, and plasma-display panels (PDPs) and the like.

BACKGROUND OF THE INVENTION

Scanning-type projection-exposure apparatus are disclosed in, for example, Japanese laid-open patent application no. 7-57986. The projection-exposure apparatus disclosed in the JP '986 application includes a projection-optical system composed of plural erecting projection-optical units having a magnification of 1. An erecting projection-optical unit consists of two optical groups, each including a dioptric system and a concave reflecting mirror. A mask and a substrate are moved together relative to the projection optical system, thereby effecting a scanning exposure of the substrate with the pattern defined by the mask. Also, the positional relationship between (i.e., the distance between) the mask and the substrate must be maintained constant during the scanning exposure.

Unfortunately, it is difficult to maintain constancy of the positional relationship between the mask and the substrate during actual scanning. A changing distance between the mask and the substrate during scanning can arise from, for example, mechanical distortion of the mask and the substrate caused by the actual scanning movement.

In view of the foregoing, there is a need for a way to maintain a constant positional relationship between the mask and the substrate during a scanning projection exposure so as to produce a high-quality projected image over the entire exposure area of the substrate.

SUMMARY OF THE INVENTION

This invention was conceived in view of the circumstances described above. One object of the invention is to provide scanning-type projection-exposure apparatus capable of forming a high-quality projected image over the entire exposure area of a photosensitive substrate. Another object is to provide methods suitable for manufacturing, as a result of an ability to maintain a constant distance between the mask and substrate, integrated semiconductor display devices and the like by scanning-type projection exposure.

According to one aspect of the invention, an exposure apparatus is provided comprising an illumination optical system for illuminating a mask or analogous structure (termed herein a "mask") that defines a pattern suitable for projection exposure of the pattern onto a suitable substrate, and a projection optical system for forming an erect image of the pattern on the substrate preferably at a magnification ratio of one. The mask and substrate are moved synchronously in a prescribed scanning direction to expose and transfer the pattern onto the substrate. The exposure apparatus comprises a first relative-displacement measuring system for measuring a displacement of the mask relative to the substrate in the scanning direction, and a second relative-displacement measuring system positioned separately from the first relative-displacement measuring system. A predetermined space is provided between the first and second relative-displacement measuring systems in a direction perpendicular to the scanning direction. The second relative-displacement measuring system is for measuring a displacement of the mask relative to the substrate in the scanning direction.

The foregoing exposure apparatus further comprises a first detection system for detecting a displacement of the mask in the direction perpendicular to the scanning direction, and a second detection system for detecting a displacement of the substrate in the direction perpendicular to the scanning direction. A position-adjustment system is provided for adjusting the position of at least one of the mask and substrate. A calculation system is provided for calculating a position-adjusting amount based on outputs from the first and second relative-displacement measuring systems and on outputs from the first and second detection systems. A control system is provided for controlling the position-adjustment system based on an output from the calculation system.

The projection-exposure apparatus preferably includes a first reference member having a first reference surface extending in the scanning direction, and a second reference member having a second reference surface extending in the scanning direction. In such a configuration, the first detection system detects a displacement of the mask in the direction perpendicular to the scanning direction relative to the first reference surface, and the second detection system detects a displacement of the substrate in the direction perpendicular to the scanning direction relative to the second reference surface.

The exposure apparatus can also comprise a driving system for moving the mask and substrate together relative to the projection optical system in the prescribed scanning direction to expose and transfer the pattern defined by the mask onto the substrate. A third detection system can be included for detecting a displacement, in the scanning direction, of the mask or substrate relative to the projection optical system. A second control system can be included for controlling the driving system based on an output from the third measuring system.

Preferably, each of the first, second and third detection systems comprises a range-measuring interferometer. Each range-measuring interferometer preferably comprises a corner reflector mounted to a mask stage or a substrate stage. Each corner reflector has a vertex situated in a plane defined by the mask or substrate, respectively, held in the mask stage or substrate stage, respectively, to which the corner reflector is mounted.

Each of the first and second relative-displacement measuring systems is preferably a differential interferometer. The first differential interferometer comprises a first corner reflector mounted to the mask stage. The second differential interferometer comprises a second corner reflector mounted to the substrate stage. The first corner reflector has an apex situated in a plane defined by the mask held in the mask stage. The second corner reflector has an apex situated in a plane defined by the substrate held in the substrate stage.

According to another aspect of the invention, methods are provided for manufacturing an electronic device such as an integrated circuit or display device. The method is executed using an exposure apparatus as summarized above. In such a method, the control system is used to control the position-adjustment system based on the outputs from the first and second relative-displacement measuring systems and the outputs from first and second detection systems. The mask and substrate are moved together in the scanning direction with respect to the projection optical system to expose and transfer the pattern onto the substrate.

According to another aspect of the invention, an exposure apparatus is provided that comprises an illumination optical system for illuminating a mask or other suitable substrate defining a pattern. The apparatus comprises a projection optical system for forming an erect image of the pattern onto a substrate at a magnification ratio of one. During exposure, the mask and substrate are moved together in a prescribed scanning direction. The exposure apparatus includes a first relative-displacement measuring system for measuring a displacement of the mask relative to the substrate in the scanning direction, and a second relative-displacement measuring system situated apart from the first relative-displacement measuring system with a predetermined space therebetween in a direction perpendicular to the scanning direction. The second relative-displacement measuring system is for measuring a displacement of the mask relative to the substrate the scanning direction. The exposure apparatus further includes a first detection system for detecting a displacement of the mask along the direction perpendicular to the scanning direction from a first reference surface extending substantially parallel to the scanning direction; a second detection system for detecting a displacement of the substrate along the direction perpendicular to the scanning direction from a second reference surface extending substantially parallel to the scanning direction; and a third relative-displacement measuring system for measuring a difference between a distance from the first reference surface to the mask along the direction perpendicular to the scanning direction and a distance from the second reference surface to the substrate in the direction perpendicular to the scanning direction. A correction system is also included to determine a correction amount for correcting an influence of a fluctuation, in the scanning direction, in a distance between the first reference surface and the second reference surface along the direction perpendicular to the scanning direction. A position adjustment system adjusts the positions of at least one of the first and second substrates. A calculation system is included for calculating a position-adjusting amount based on outputs from the first and second relative-displacement measuring systems, outputs from the first and second detection systems, and an output from the correction system. A control system controls the position adjustment system based on an output from the calculation system.

Preferably, the exposure apparatus includes a driving system for moving the mask and substrate together with respect to the projection optical system along the prescribed scanning direction to expose and transfer the pattern of the mask onto the substrate. The apparatus also preferably includes a third detection system for detection a displacement of the mask or substrate in the scanning direction relative to the projection optical system, and a second control system for controlling the driving system based on an output from the third measuring system.

The first and second reference surfaces are preferably reflective surfaces of two long mirrors mounted to the projection optical system.

The third relative-displacement measuring system is preferably a differential interferometer.

The exposure apparatus further preferably includes a first beam splitter for splitting a beam emitted from a light source into a first beam directed to the first reference surface and a second beam directed to the second reference surface. A first photodetector is used for receiving an interference beam resulting from interference between the first beam reflected from the first reference surface via a reflective member fixed to the mask stage, and the second beam reflected from the second reference surface through a reflective member fixed to the substrate stage.

According to yet another aspect of the invention, methods are provided for manufacturing a display device or other electronic device. In such a method, a correction amount is calculated, based on outputs from the first and second detection systems and an output from the third relative-displacement measuring system, to correct an influence of a fluctuation in the distance between the first reference surface and the second reference surface in the scanning direction. The distance between the first reference surface and the second reference surface is perpendicular to the scanning direction. The first and second substrates are moved together in the scanning direction with respect to the projection optical system while causing the control system to control the position adjustment system based on outputs from the first and second relative-displacement measuring systems and an output from the beam fluctuation correcting unit, thereby exposing and transferring the pattern of the mask onto the substrate.

The above and other objects, features, and advantages of the present invention will be further described in the detailed description which follows, with reference to the drawings by way of non-limiting exemplary embodiments of the present invention.

DETAILED DESCRIPTION OF PREFERRED EMBODIMENTS

A first example embodiment of a projection-exposure apparatus according to the invention is operable to form an equi-magnification erect image of a pattern defined by a mask. The embodiment performs a scanning exposure by moving the mask and substrate synchronously relative to the projection-optical system, thereby minimizing transfer errors if the mask and substrate are moved in a direction perpendicular to the scanning direction, or in a rotational manner about the optical axis of the projection-optical system during exposure.

Relative displacements of the mask and substrate along the scanning direction are measured at two positions, separated by a predetermined distance, along a direction perpendicular to the scanning direction. The measurements are performed using two relative-displacement measurement systems, such as two differential interferometers. The measurement results from the two relative-displacement measurement systems are used to control any required compensating positional adjustments or relative rotational adjustments of the mask and/or substrate.

Displacements of the mask and/or substrate along a direction perpendicular to the scanning direction are separately measured using two detection systems, such as range-measuring interferometers. The measurement results from the two detection systems are used to control a deviation or positional change of the mask and/or substrate along the direction perpendicular to the scanning direction and relative to the projection optical system. In other words, the positional deviation of the mask and substrate along the direction perpendicular to the scanning direction can be controlled.

Thus, this embodiment produces an excellent projection image over the entire exposure region of the substrate. This is achieved by controlling any positional deviations and/or rotational deviations of the mask and substrate along the scanning direction, and by controlling any positional deviations arising during scanning between the mask and substrate in a direction perpendicular to the scanning direction.

Displacements of the mask and substrate along the scanning direction relative to the projection optical system are measured using a detection system, such as a range-measuring interferometer. Movement of the mask and substrate along the scanning direction relative to the projection optical system can be controlled based on the measurement results from the detection system.

Figure 1:
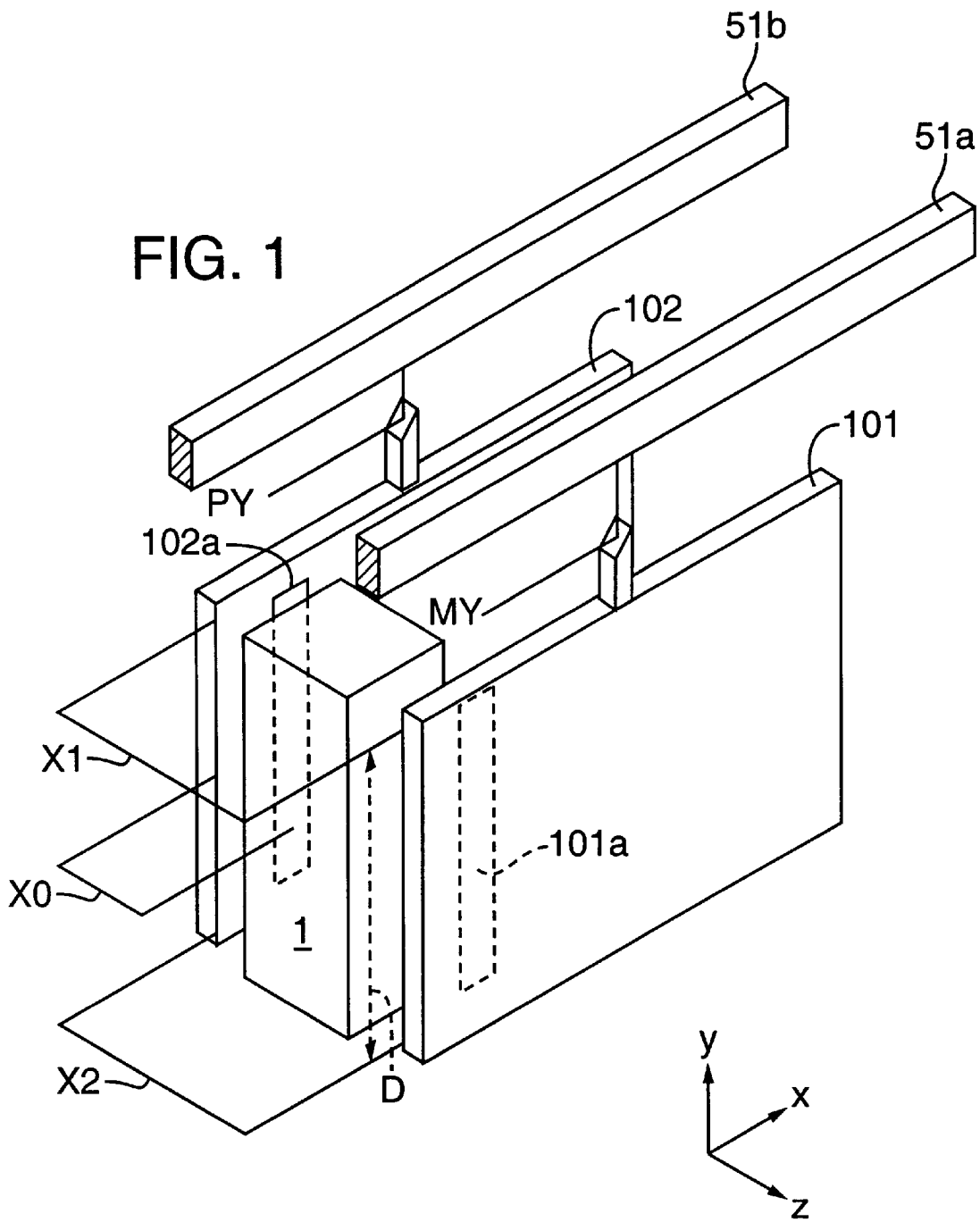
FIG. 1 is a perspective view schematically illustrating certain aspects of a portion of an exposure apparatus according to a first representative embodiment of the invention.
Figure 2:
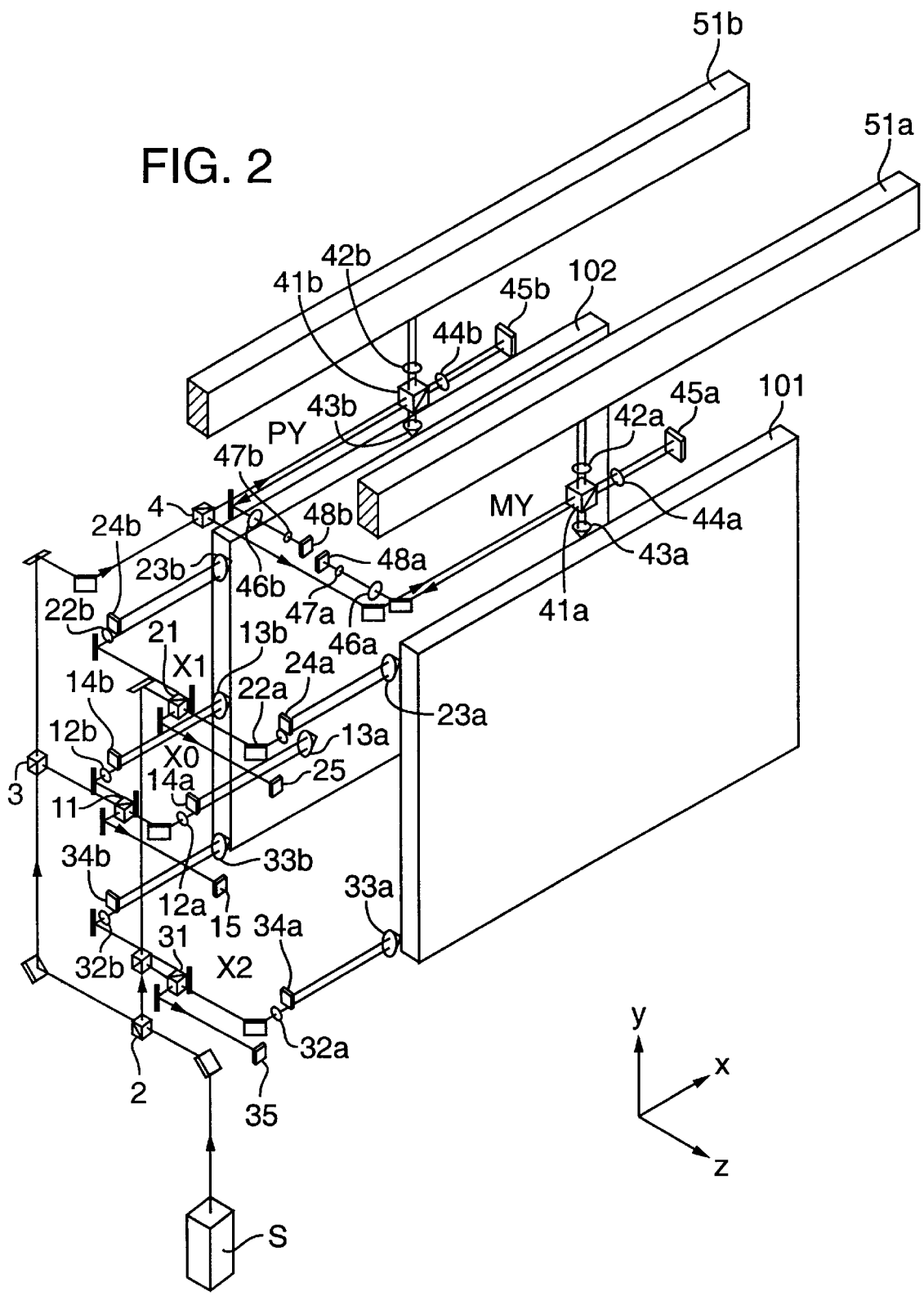
FIG. 2 is a perspective view schematically illustrating an internal configuration of each of the interferometers used in the FIG. -1 embodiment.

In FIGS. 1 and 2, the mask and substrate are represented by first and second plates 101, 102, respectively (the first plate 101 is referred to as the "mask" and the second plate 102 is referred to as the "substrate"). The z axis is perpendicular to the plates 101, 102. The substrate 102 can be made of glass on which a resist is applied. The x axis is parallel to the scanning direction and parallel to a principal plane of the substrate 102. The y axis is perpendicular to the scanning direction and parallel to the principal plane of the substrate 102.

The FIG. -1 embodiment comprises an illumination optical system (not shown, but in the +z direction relative to the mask 101) for illuminating the mask 101 defining a pattern to be transferred to the substrate 102. The mask 101 is supported so as to be substantially parallel with the xy plane. The illumination optical system illuminates a region 101a of the mask 101. Light passing through the pattern region 101a forms an equi-magnification erect image of the mask pattern by passage through a projection optical system 1 onto a corresponding exposure region 102a of the substrate 102. The projection optical system 1 can comprise plural projection optical units, each of which forming an equi-magnification erect image. Such a projection optical system is disclosed in, for example, Japanese laid-open patent application no. 7-57986.

Scanning exposure is performed by moving the mask 101 and substrate 102 synchronously along the x direction (scanning direction). After a complete scanning exposure, the entire pattern of the mask 101 is transferred onto a corresponding exposure region of the substrate 102.

Figure 5:
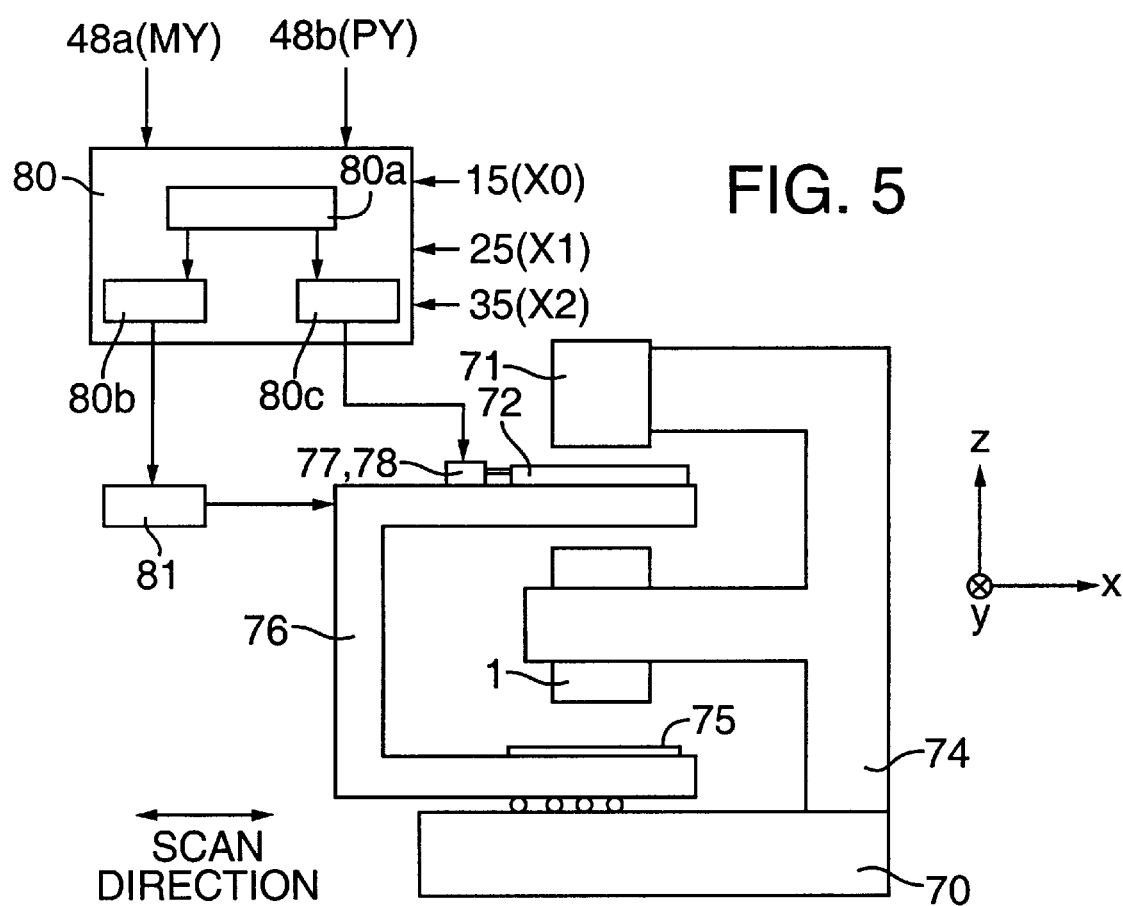
FIG. 5 illustrates a mechanism for driving and guiding a mask 101 and a substrate 102 together in the exposure apparatus shown in FIG. 1.

With respect to this representative embodiment, FIG. 5 schematically illustrates a preferred mechanism for synchronously driving and guiding the mask 101 and the substrate 102. The mask 101 (not shown in FIG. 5) is mounted on a mask stage 72, and the substrate 102 (not shown in FIG. 5) is mounted on a substrate stage 75. The illumination optical system 71 and the projection optical system 1 are supported by a frame 74 secured to a base 70. During scanning exposure, the mask stage 72 and the substrate stage 75 are held and moved together as a single body by a carriage 76. Movement of the carriage 76 is in the x direction.

The mask stage 72 can be controllably moved in the x and y directions and rotationally about the z axis sing X-direction actuators 77, 78 and a Y-direction actuator (not shown but structured similarly to the X-direction actuators). The X- and Y-direction actuators also control any positional deviations arising of the mask 101 and the substrate 102 in the scanning direction (x direction) and the y direction, as well as any rotational deviations of the mask and substrate with respect to the optical axis of the projection optical system 1.

For high-precision movement of the mask and stage, a mechanism as disclosed in U.S. Pat. No. 5,523,574, incorporated herein by reference, can be employed.

Referring further to FIG. 1, a range-measuring interferometer X0 is used for measuring a displacement of the substrate 102 along the x direction relative to the projection optical system 1. Differential interferometers X1 and X2 are provided for measuring a relative displacement between the mask 101 and the substrate 102 along the x direction. More specifically, the differential interferometers X1 and X2 measure locations on the mask 101 and the plate 102 that are separated by a predetermined distance in the y direction (perpendicular to the scanning direction).

A range-measuring interferometer MY is provided for measuring a displacement of the mask 101 in the y direction relative to the projection optical system 1. Similarly, a range-measuring interferometer PY is provided for measuring a displacement of the substrate 102 in the y direction relative to the projection optical system 1.

Referring further to FIG. 5, a main control nit 80 receives the following: (a) an output from a photodetector 15 corresponding to a displacement of the substrate 102 in the in the x direction relative to the projection optical system 1, as measured by the range-measuring interferometer X0; (b) outputs from photodetectors 25, 35 corresponding to a relative displacement of the mask 101 and substrate 102, respectively, in the x direction as measured by the differential interferometers X1, X2, respectively; (c) an output from a photodetector 48a corresponding to a displacement of the mask 101 in the y direction relative to the projection optical system 1 as measured by the range-measuring interferometer MY; and (d) an output from a photodetector 48b corresponding to a displacement of the substrate 102 in the y direction relative to the projection optical system 1 as measured by the range-measuring interferometer PY.

The main control unit 80 calculates each displacement or each correction, based on input information output from the interferometers as summarized above. The main control unit 80 controls an "adjustment system" including the actuators 77 and 78. The adjustment system is operable to correct any rotational displacement of the mask 101 about the z-axis and positional displacements of the mask 101 in the x-axis and y-axis directions relative to the substrate 102. The main control unit 80 controls a carriage drive system 81 operable to move the carriage 76 in the x direction (scanning direction), for example, based on the output from the range-measuring interferometer X0 pertaining to displacement of the substrate 102 in the x direction, relative to the projection optical system 1.

A "moving system" operable to move the mask 101 and the substrate 102 together as one body in the scanning direction (x direction) relative to the projection optical system 1 comprises the mask stage 72, the substrate stage 75, the carriage 76, and the carriage drive system 81. Thus, the relative positional relationship between the mask 101 and the substrate 102 is precisely controlled in this embodiment.

The main control unit 80 comprises a calculation unit 80a operable to perform arithmetical calculations, a carriage control unit 80b operable to control the moving system 72, 75, 76, 81, and a stage control unit 80c operable to control the adjustment system 77, 78.

During transfer of the mask pattern onto the photosensitive substrate 102 by projection exposure, the carriage control unit 80b actuates the carriage drive system 81 to move the carriage 76 along the scanning direction (x direction) while monitoring a position, a displacement, or a scanning speed of the substrate 102 based on the output of the range-measuring interferometer X0. Meanwhile, the calculation unit 80a determines a correcting amount ($\Delta X$, $\Delta Y$, $\Delta \theta$) indicating any relative displacements of the mask 101 with respect to the substrate 102, based on the outputs from the interferometers X1, X2, MY, PY.

More specifically, the calculation unit 80a calculates a relative displacement (first correction) $\Delta X$ of the mask 101 in the x direction relative to the substrate 102 according to the following Equation (1) based on respective outputs from the two differential interferometers X1, X2 (more specifically, outputs from the photodetectors 25, 35, respectively).

$$\Delta X = (x_1 + x_2)/2 \quad (1)$$

wherein $x_1$ is an observed value produced by the interferometer X1, and $x_2$ is an observed value produced by the interferometer X2.

The calculation unit 80a calculates a relative displacement (second correction) $\Delta Y$ of the mask 101 in the y direction relative to the substrate 102 according to the following Equation (2) based on respective outputs from the two range-measuring interferometers MY, PY, (more specifically, outputs from the photodetectors 48a, 48b, respectively).

$$\Delta Y = M_y - P_y \quad (2)$$

wherein $M_y$ is an observed value produced by the interferometer MY, and $P_y$ is an observed value produced by the interferometer PY.

The calculation unit 80a also calculates a relative rotation (third correction) $\Delta \theta$ of the mask 101 in the z direction relative to the substrate 102 according to the following Equation (3) based on respective outputs from the two differential interferometers X1, X2 (more specifically, outputs from the photodetectors 48a and 48b).

$$\Delta \theta = (x_1 - x_2)/D \quad (3)$$

wherein D is a distance between measurement optical paths of the two differential interferometers X1, X2, or a distance between measurement points of the two differential interferometers X1, X2, as shown in FIG. 1.

The stage control unit 80c actuates the adjustment system to cause the values $\Delta X$, $\Delta Y$, $\Delta \theta$ determined by the calculation unit 80a to become zero or a predetermined value, thereby correcting a relative positional displacement of the mask 101 relative to the substrate 102. In other words, based on the output from the calculation unit 80a, the stage control unit 80c actuates the adjustment system (including the actuators 77 and 78 as shown in FIG. 5) to move the mask stage 72 (holding the mask 101) so that the positional displacement of the mask 101 relative to the substrate 102 becomes zero or other predetermined value.

Transfer-exposure of the mask pattern onto the substrate 102 is carried out, simultaneously with adjustment of any relative positional displacement of the mask 101 and plate 102, by illuminating the mask 101 with the illumination optical system 61 while the mask 101 and the substrate 102 are moved together as one body in the scanning direction (x direction) relative to the projection optical system 1. Thus, an excellent image of the mask pattern is reproduced on the photosensitive substrate 102.

Any rotational displacement about the z axis, and any positional displacements along the x axis and y axis between the substrate 102 and the mask 101 can be corrected using a drive system adapted to allow only the substrate stage 75 to rotate about the z axis and to move along the x and y axes. Alternatively, a drive system can be used that allows both the mask stage 72 and the substrate stage 75 to rotate about the z-axis and along the x and y axes. In either scheme, a stage control unit 80c is preferably used to controllably actuate a respective drive system for rotating and moving one or both the substrate stage 75 and the mask stage 72 about the z axis and along their x and y axes.

FIG. 2 shows more structural details of a representative interferometer used in the exposure apparatus of this first embodiment. A laser beam is emitted by a laser light source S. The laser beam is reflected by a beam splitter 2 to reach the differential interferometers X1 and X2. Since both differential interferometers X1, X2 have identical structure, as is shown in FIG. 2, the structure of only the differential interferometer X1 is described below, and reference numerals for corresponding components of the differential interferometer X2 are placed in parentheses.

The laser beam reflected by the beam splitter 2 is split into two beams by a polarization half prism 21 (31). The beam that has passed through the polarization half prism 21 (31) strikes, through a quarter-wavelength plate 22a (32a), a corner cube 23a (33a) mounted to the mask stage. The beam is reflected by the corner cube 23a (33a), further reflected by a fixed mirror 24a (34a), and returns to the corner cube 23a (33a). The beam reflected again by the corner cube 23a (33a) returns to the polarization half prism 21 (31) through the quarter-wavelength plate 22a (32a).

The beam that was reflected by the polarization half prism 21 (31) passes through a quarter-wavelength plate 22b (32b) and strikes a corner cube 23b (33b) mounted to the substrate stage. The beam reflected by the corner cube 23b (33b) is further reflected by a fixed mirror 24b (34b), and then returns to the corner cube 23b (33b). The beam reflected again by the corner cube 23b (33b) returns to the polarization half prism 21 (31) through the quarter-wave plate 22b (32b). The two beams interfere with each other at the polarization half prism 21 (31), and an interference beam is generated. The interference beam is directed to the photodetector 25 (35).

The differential interferometer X1 measures a relative displacement along the x direction between the mask 101 and the substrate 102, based on the output from the photodetector 25. Similarly, the differential interferometer X2 measures a relative displacement along the x direction between the mask 101 and the substrate 102, based on the output from the photodetector 35. The differential interferometers X1 and X2 are arranged to measure relative displacements at positions separated from each other by a predetermined length in the y direction. Based on the measurement results from the differential interferometers X1 and X2, the calculation unit 80a (shown in FIG. 5) determines a relative positional displacement ΔX between the mask 101 and the substrate 102 in the x direction, and a relative rotational displacement Δθ between the mask 101 and the substrate 102 about the z axis. The stage control unit 80c can correct the unwanted displacements of the mask 101 relative to the substrate 102 by actuating the adjustment system, such as the actuators 77 and 78 shown in FIG. 5, so that the calculated values (ΔX, Δθ) obtained by the calculation unit 80a become zero or reach a predetermined value.

Whenever the mask 101 and the substrate 102 move along the x and y directions, or rotate about the z axis, the corner cubes 23a, 23b, 33a and 33b are similarly moved or rotated. The characteristics of each corner cube maintain constancy of the incidence angle of the interference beams entering the photodetectors 25, 35. However, if the corner cubes 23a, 23b, 33a and 33b shift in the y direction by 5, then the incident position of the beam on the fixed mirrors 24a, 24b, 34a and 34b shifts in the y direction by 2δ. Using these differential interferometers to measure a relative displacement between the mask 101 and the substrate 102 is equivalent to measuring the positions of the vertices of the corner cubes 23a, 23b, 33a, 33b. Therefore, it is preferable to place the vertex of each corner cube on the same plane as the plane of the respective mask or substrate in order to reduce the so called Abbe error.

As shown in FIG. 2, the laser beam emitted from the laser light source S reaches the range-measuring interferometer X0 after the beam passes through the beam splitter 2 and is reflected by the beam splitter 3. The beam reflected by the beam splitter 3 is split into two beams by the polarization half prism 11. The beam passing through the polarization half prism 11 reaches, through a quarter-wavelength plate 12a, a corner cube 13a attached to the projection optical system 1. The beam reflected by the corner cube 13a is further reflected by a fixed mirror 14a and returns to the corner cube 13a. The beam reflected again by the corner cube 13a returns to the polarization half prism 11 through the quarter-wavelength plate 12a.

The beam reflected by the polarization half prism 11 passes through the quarter-wavelength plate 12b and is received by a corner cube 13b secured on the substrate stage. The beam reflected by the corner cube 13b is reflected by a fixed mirror 14b and returns to the corner cube 13b. The beam reflected again by the corner cube 13b returns to the polarization half prism 11 through the quarter-wave plate 12b. The two beams thus reaching the polarization half prism 11 interfere with each other to produce an interference beam directed to the photodetector 15.

Thus, the range-measuring interferometer X0 can measure a displacement of the substrate 102 in the x direction relative to the projection optical system 1 based on the output from the photodetector 15. As a result, the carriage control unit 80b as shown in FIG. 5 can control the carriage control system 81 while monitoring the position, displacement and scanning speed of the substrate 102 in the scanning direction (x direction).

In order to reduce measurement errors involved in rotation of the substrate 102 about the z-axis in the range-measuring interferometer X0, the corner cube 13b is preferably positioned near the center of the substrate 102 in the y direction. To reduce Abbe error in the range-measuring interferometer X0, it is preferable to place the vertex of each corner cube within the same plane as the exposed plate.

As shown in FIG. 2, the laser beam emitted from the laser light source S is further split into two beams by the beam splitter 4 after the beam passes through the beam splitters 2 and 3. The beam reflected by the beam splitter 4 reaches the range-measuring interferometer MY, and the beam passing through the beam splitter 4 reaches the range-measuring interferometer PY. Since the range-measuring interferometers MY and PY have the same structure, as indicated in FIG. 2, the structure of the range-measuring interferometer MY is described below wherein reference numerals pertaining to corresponding components of the range-measuring interferometer PY are in parentheses.

The laser beam reflected by the beam splitter 4 is split into two beams by a polarization half prism 41a (41b). The beam reflected by the polarization half prism 41a (41b) reaches, through a quarter-wavelength plate 42a (42b), a reflection surface (reference surface) of a long mirror 51a (51b) attached to the projection optical system 1. The long mirror 51a (51b) serves as a reference member. The reflection surface (reference surface) of the long mirror 51a (51b) is parallel to an x-z plane and generally extends in the x direction. The beam reflected by the reflection surface of the long mirror 51a (51b) propagates to the polarization half prism 41a (41b) through the quarter-wavelength plate 42a (42b). The beam passing through the polarization half prism 41a (41b) reaches a corner cube 43a mounted to the mask stage (the corner cube 43b is mounted on the substrate stage). The beam reflected by the corner cube 43a 43b) returns to the polarization half prism 41a (41b).

The beam passing through the polarization half prism 41a (41b) comes to a fixed mirror 45a (45b) through a quarter-wavelength plate 44a (44b). The beam reflected by the fixed mirror 45a (45b) returns to the polarization half prism 41a (41b) through the quarter-wavelength plate 44a (44b). The beam reflected by the polarization half prism 41a (41b) propagates to the corner cube 43a mounted to the mask stage (the corner cube 43b is mounted on the substrate stage). The beam reflected by the corner cube 43a (43b) returns to the polarization half prism 41a (41b).

The two beams returning to the polarization half prism 41a (41b) interfere with each other and generate an interference beam that is directed to the photodetector 48a (48b) through a beam-reduction optical system comprising a pair of lens components 46a (46b) and 47a (47b).

Thus, the range-measuring interferometer MY measures a displacement, in the y direction, of the mask 101 relative to the projection optical system 1 based on the output from the photodetector 48a. Similarly, the range-measuring interferometer PY measures a displacement, along the y direction, of the plate 102 relative to the projection optical system 1 based on the output from the photodetector 48b. Based on the measurement results from the two range-measuring interferometers (MY, PY), the calculation unit 80a (FIG. 5) determines a relative positional displacement ΔY between the mask 101 and the substrate 102 in the y direction. The stage control unit 80c corrects the displacement of the mask 101 relative to the substrate 102 by driving the actuators 77 and 78 so that the calculated value ΔY becomes zero.

In order to reduce measurement errors involved with rotation of the mask 101 or the substrate 102 about the z-axis in the range-measuring interferometers MY and PY, the corner cubes 43a and 43b are preferably positioned near the center of the mask 101 and the substrate 102 along the x direction, respectively. To reduce Abbe error in the range-measuring interferometers MY and PY, it is preferable to place the vertex of each corner cube on the same plane as the plane of the pattern defined by the mask 101 or as the plane of the substrate 102 exposed to light.

Figure 3:
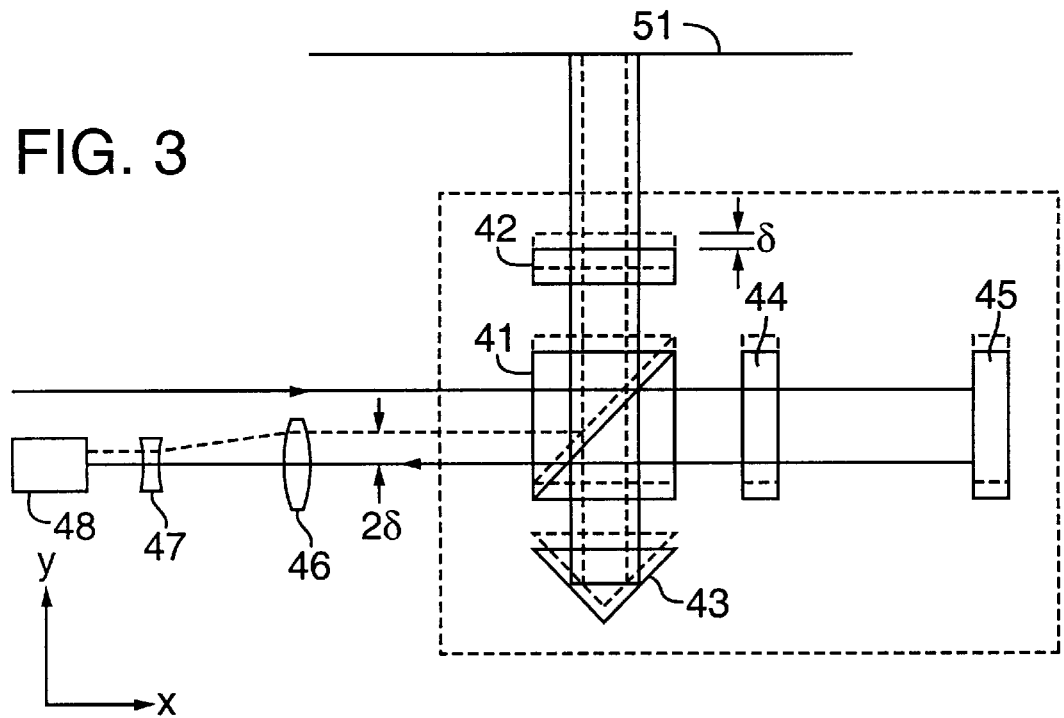
FIG. 3 illustrates the measuring interferometer MY (PY) shown in FIG. 2, particularly depicting the function of the beam reductive optical system.

FIG. 3 illustrates a preferred embodiment of a beam reduction system (46, 47) used in the range-measuring interferometer MY (PY) of FIG. 2. In FIG. 3, the two range-measuring interferometers MY and PY are collectively shown without using the suffix a or b. The rectangular region surrounded by a dashed line in FIG. 3 encompasses components that are mounted to the mask stage or the substrate stage. Thus, the polarization half prism 41, the quarter-wavelength plate 42, the quarter-wavelength plate 44, and the fixed mirror 45 are moved together with the mask 101 (the plate 102) in the range-measuring interferometer MY (PY).

Accordingly, if the mask 101 (the plate 102) moves by δ in the +y direction, then the polarization half prism 41, the quarter-wavelength plate 42, the quarter-wavelength plate 44, and the fixed mirror 45 also move by δ in the +y direction, as indicated by the broken lines in the figure that are associated with these components. As a result, the interference beam propagating from the polarization half prism 41 moves 2δ in the +y direction. The beam reduction optical system 46, 47, serving to correct beam deviation, is provided on an optical path between the polarization half prism 41 and the photo-detector 48. Such a configuration makes it possible to adjust a positional deviation of the interference beam to be less than a predetermined level in accordance with the magnification of the beam reduction optical system 46, 47. By setting the magnification of the beam reduction optical system 46, 47 at an appropriate level, the photo-detector 48 can receive the interference beam; also, measurement of displacement can be securely conducted even when the displacement of the mask 101 (the substrate 102) in the +y direction grows large.

Figure 4:
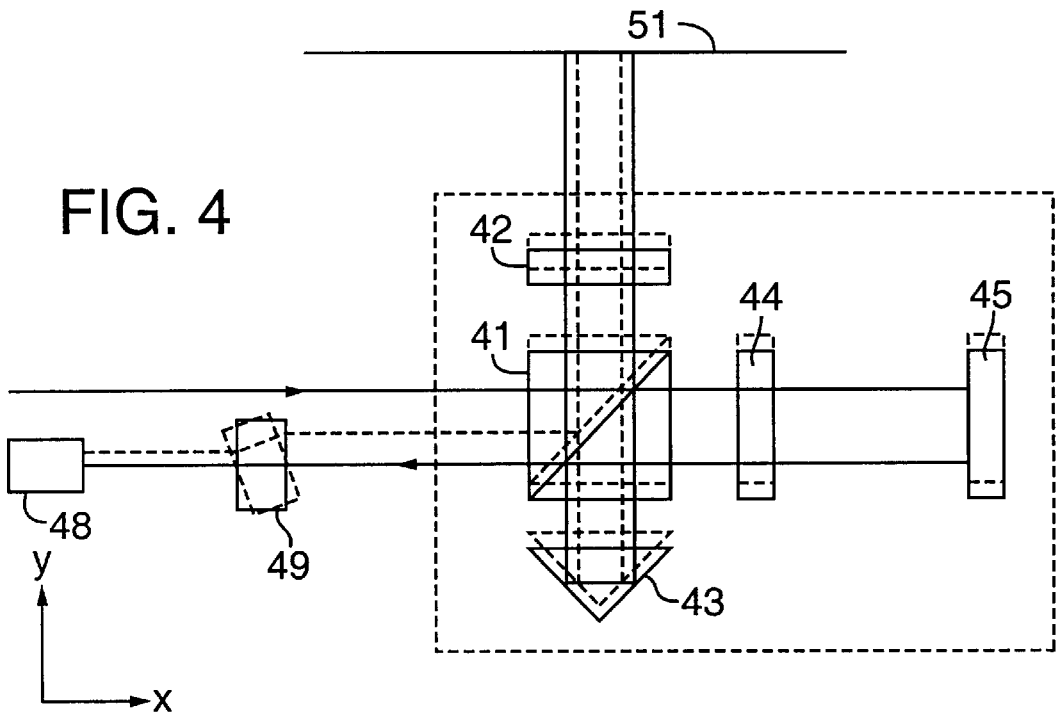
FIG. 4 illustrates a modification of the measuring interferometer MY (PY) shown in FIG. 3.

FIG. 4 illustrates a modification of the system of FIG. 3. The modification as shown in FIG. 4 is different from the system of FIG. 3 in that the beam reduction optical system of FIG. 3 is replaced with a parallel flat plane 49. In FIG. 4, rotation of the parallel flat plate 49 about the z-axis enables the positional deviation of the interference beam to be controlled to less than a prescribed level. Thus, by setting a rotational angle of the parallel flat plate 49 at an appropriate level, measurement of the displacement of the mask 101 (the substrate 102) in the +y direction can be reliably performed.

As described above with respect to this embodiment, any positional displacement arising between the mask and substrate in the scanning direction and in a direction perpendicular to the scanning direction, as well as any rotational deviation, arising between the mask 101 and the substrate 102 can be corrected with high accuracy. This allows production of an excellent projected image over the entire exposure region of the photosensitive substrate 102 even if scanning-exposure is performed while moving the mask 101 and the substrate 102 synchronously with respect to the projection optical system. This allows production of high-quality display devices, semiconductor devices (such as LSI, thin-film magnetic heads, imaging devices, etc.) by photolithography using this exposure apparatus.

Figure 6:
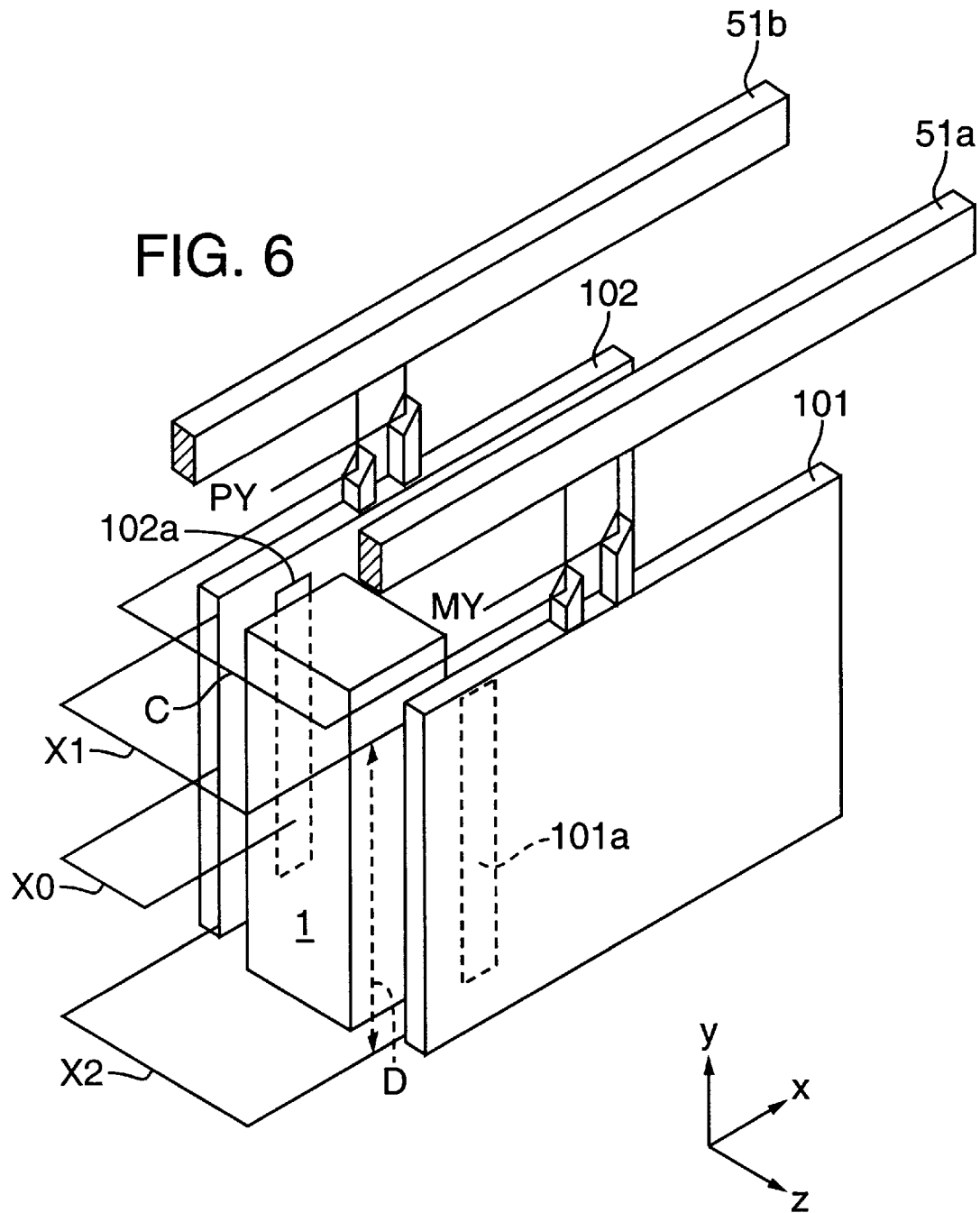
FIG. 6 is a perspective view schematically illustrating the structure of a part of an exposure apparatus according to another embodiment of the invention.
Figure 7:
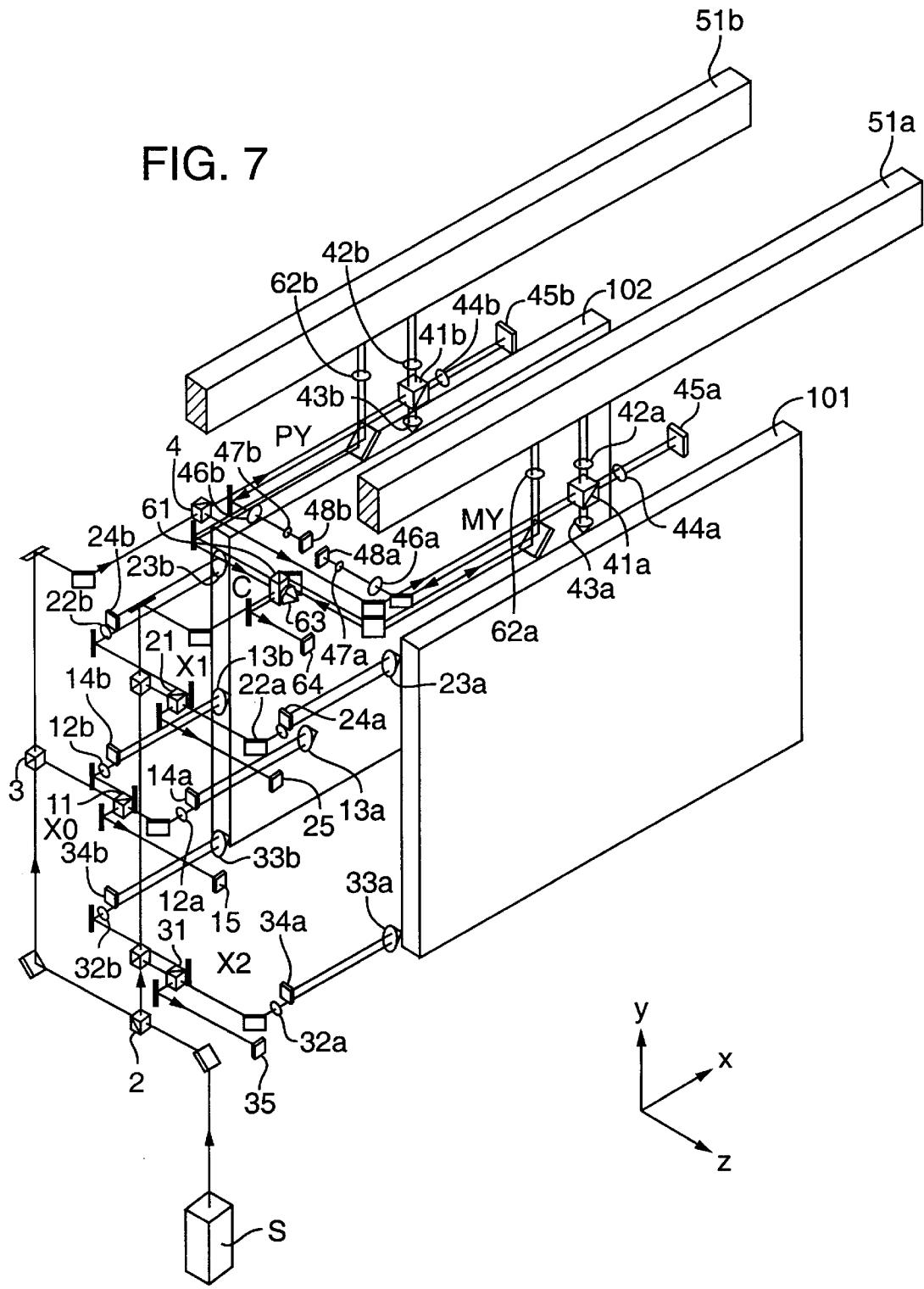
FIG. 7 is a perspective view showing the interior structure of the interferometers shown in FIG. 6.

A second example embodiment of an apparatus according to the invention is also operable to form an equi-magnification erect image. FIG. 6 illustrates main assemblies of an exposure apparatus according to the second example embodiment of the present invention. FIG. 7 schematically illustrates an internal configuration of each interferometer as shown in FIG. 6.

The second example embodiment is operable to perform a scanning exposure by moving the mask and substrate synchronously as one body relative to the projection optical system. Thus, transfer errors are minimized even if the mask and substrate are moved in a direction perpendicular to the scanning direction, or even if the mask and substrate are rotated about an optical axis.

Relative displacements arising between the mask and substrate in the scanning direction are measured at two locations separated by a predetermined distance in a direction perpendicular to the scanning direction by using two relative-displacement measurement systems such as two differential interferometers X1 and X2. Positional displacements and rotational displacements in the scanning direction of the mask and substrate can be controlled based on the measurement results from the two relative-displacement measurement systems.

Displacements of the mask from the substrate in a direction perpendicular to the scanning direction relative to a first reference surface and displacements of the substrate in the direction perpendicular to the scanning direction relative to a second reference surface are measured by using two detection systems MY an PY such as range-measuring interferometers. The first reference surface and the second reference surface are preferably reflective surfaces of two long mirrors attached to the projection optical system and extending in the scanning direction, respectively.

The difference between a distance from the first reference surface to the mask in the direction perpendicular to the scanning direction and a distance from the second reference surface to the substrate in the direction perpendicular to the scanning direction is measured in the scanning direction by using a relative-displacement measurement system C such as a differential interferometer.

Based on outputs from the two detection systems MY and PY and on an output from the relative-displacement measurement system C, the influence of fluctuation in the distance between the first reference surface and the second reference surface, which occurs along the scanning direction, can be corrected. The distance between the first and second reference surfaces is perpendicular to the scanning direction. In other words, even if the distance measured in the direction perpendicular to the scanning direction between the first and second reference surfaces changes in the scanning direction, the mask and substrate can be adjusted together in the direction perpendicular to the scanning direction while correcting any such distance fluctuation. As a result, positional displacements of the mask and substrate in the direction perpendicular to the scanning direction are precisely controlled to extremely low levels.

Such control (of positional displacements and rotational displacements of the mask and substrate in the scanning direction, and positional displacements of the mask and substrate in the direction perpendicular to the scanning direction) while correcting any displacements of the reference surfaces due to bending or warping allows production of an excellent projection image over the entire exposure region of the photosensitive substrate.

A detection system X0, such as a range-measuring interferometer, may be used to measure a displacement of the mask or substrate in the scanning direction relative to the projection optical system 1, so that movement of the mask or substrate in the scanning direction relative to the projection optical system 1 can be controlled based on measurement results obtained by the detection system X0.

In FIGS. 6 and 7, the z axis is perpendicular to a plate designating the substrate 102 which can be a glass plate on which resist is applied. The x axis is an axis parallel to the scanning direction and parallel to a principal plane of the substrate 102. The y axis is perpendicular to the scanning direction and parallel to the principal plane of the substrate 102.

The exposure apparatus of FIG. 6 comprises an illumination optical system (not shown) for illuminating the mask 101 defining a pattern to be transferred to the substrate 102. The mask 101 is parallel to the x-y plane. The illumination optical system is operable to illuminate a pattern region 101a of the mask 101 which is supported so as to be parallel to the xy plane. Light passing through the pattern region 101a passes through a projection optical system 1 and forms an equi-magnification erect image of the mask pattern on a corresponding exposure region 102a of the substrate 102.

The projection optical system 1 can comprise multiple projection optical units each forming an equi-magnification erect image. Such a projection optical system is disclosed in, for example, Japanese laid-open patent document no. 7-57986 and Japanese laid-open patent document no. 8-211294.

The exposure apparatus of FIG. 6 performs a scanning exposure of the substrate 102 by moving the mask and substrate synchronously as one body in the x direction (scanning direction). Consequently, the mask pattern can be transferred to a corresponding exposure field of the substrate 102.

Figure 11:
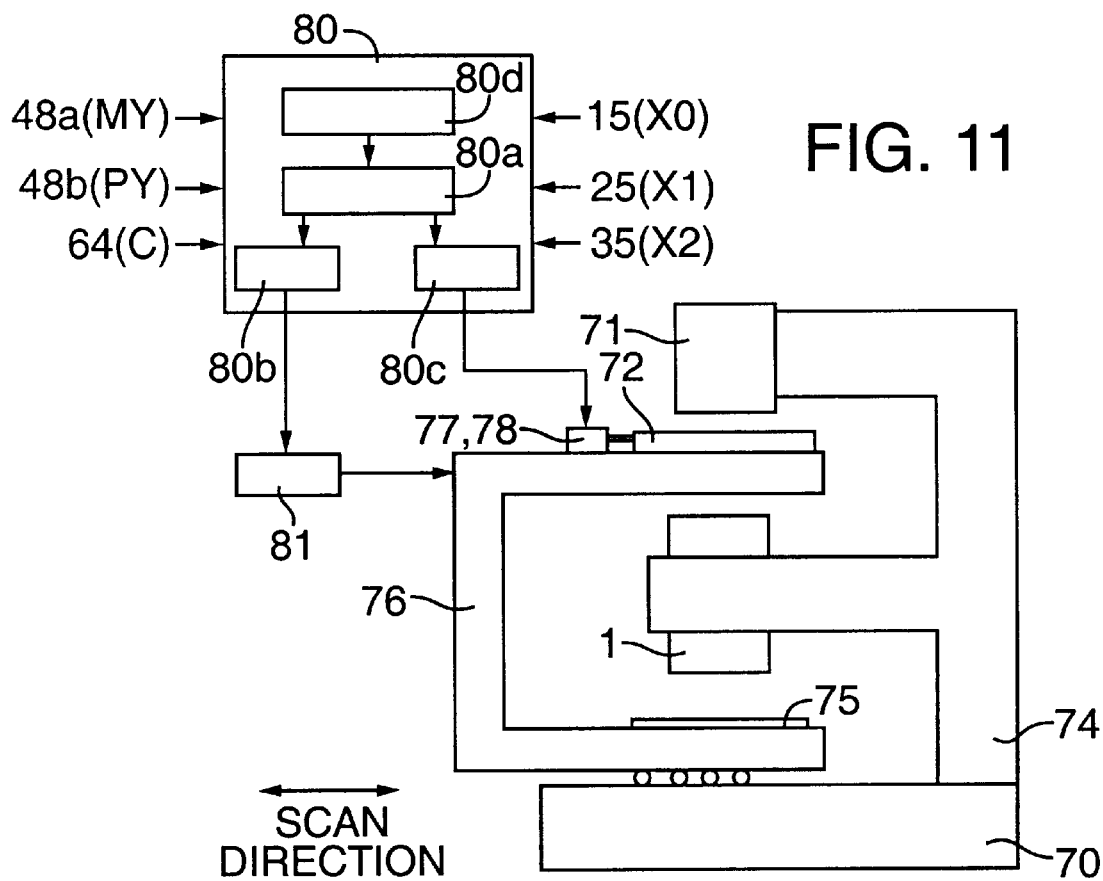
FIG. 11 illustrates a mechanism for driving and guiding a mask 101 and a substrate 102 together in the exposure apparatus shown in FIG. 6.

FIG. 11 is a block diagram of a mechanism for driving and guiding a mask 101 and a substrate 102 together as one body in the exposure apparatus of FIG. 6. The mask 101 (not shown in FIG. 11) is mounted on a mask stage 72, while the substrate 102 (not shown in FIG. 11) is mounted on a substrate stage 75. The illumination optical system 71 and the projection optical system 1 are supported by a frame 74 secured to a base 70. Whenever a scanning exposure is conducted, the mask stage 72 and the substrate stage 75 are supported together on a carriage 76 and are driven in the x direction.

The mask stage 72 can be driven in the x axis and the y axis and about the z axis by x-direction actuators 77, 78 and a y-direction actuator (not shown but structured similarly to the x-direction actuators), respectively. The driving mechanism of FIG. 11 can control a positional displacement arising between the mask 101 and the substrate 102 in the scanning direction (x direction) as well as a rotational deviation around an optical axis of the projection optical system 1. In addition, the driving mechanism enables control of positional displacements of the mask 101 and the substrate 102 in the direction perpendicular to the scanning direction, i.e., the y direction.

To attain high-precision driving, a mechanism can be used as disclosed in U.S. Pat. No. 5,523,574, incorporated herein by reference.

FIG. 6 also shows a range-measuring interferometer X0 for measuring a displacement of the plate 102 in the x direction relative to the projection optical system 1. Differential interferometers X1 and X2 are provided to measure a relative displacement between the mask 101 and the substrate 102 in the x direction. The differential interferometers X1 and X2 are arranged to measure the positions on the mask 101 and the substrate 102 that are separated by a predetermined distance in the y direction (perpendicular to the scanning direction).

A range-measuring interferometer MY is provided to measure a displacement of the mask 101 in the y direction relative to a long mirror 51a attached to the projection optical system 1. A range-measuring interferometer PY is also provided to measure a displacement of the substrate 102 in the y direction relative to a long mirror 51b attached to the projection optical system 1. A differential interferometer C is provided for measuring a difference between a distance in the y direction from a reflection surface of the long mirror 51a to the mask 101 and a distance in the y direction from a reflection surface of the long mirror 51b to the substrate 102.

In the embodiment of FIG. 6, a main control unit 80 (FIG. 11) receives the following: (a) an output from a photodetector 15 of the range-measuring interferometer X0 for measuring a displacement in the x direction of the substrate 102 relative to the projection optical system 1; (b) outputs from photodetectors 25 and 35 of the differential interferometers X1, X2, respectively, for measuring a relative displacement in the x direction between the mask 101 and the substrate 102; (c) an output from a photodetector 48a of the range-measuring interferometer MY for measuring a displacement in the y direction of the mask 101 relative to the projection optical system 1; (d) an output from a photodetector 48b of the range-measuring interferometer PY for measuring a displacement in the y direction of the substrate 102 relative to the projection optical system 1; and (e) an output from a photodetector 64 of the differential interferometer C for measuring a difference in the y direction between a distance from a reflection surface of the long mirror 51a to the mask 101 and a distance in the y direction from a reflection surface of the long mirror 51b to the substrate 102.

The main control unit 80 determines a displacement (or a correcting amount) based on the information output from each interferometer, and controls a driving system, which includes the actuators 77 and 78 to correct any rotational displacement of the mask 101 about the z axis and any positional displacements of the mask 101 along the x axis and the y axis relative to the substrate 102. The main control unit 80 controls a carriage drive system 81 to move the carriage supporting the mask stage 72 and the substrate stage 75 as shown in FIG. 11 in the x direction (in the scanning direction). Such controlled movement is based on the output from the range-measuring interferometer X0 for measuring the displacement of the substrate 102 in the x direction relative to the projection optical system 1.

A moving system for moving the mask 101 and the substrate 102 as an integral body in the scanning direction (x direction) relative to the projection optical system 1 comprises the carriage 76 and the carriage drive system 81.

As mentioned above, a relative positional relationship between the mask 101 and the substrate 102 is controlled with high precision. The main control unit 80 comprises a correction unit 80d, a calculation unit 80a that performs arithmetical calculations, a carriage control unit 80b that controls a moving system 72, 75, 76, 81, and a stage control unit 80c that controls an adjustment system 77, 78.

Prior to actual projection and exposure of the mask pattern onto the photosensitive substrate 102, the correction unit 80 determines an amount by which any fluctuation in the distance between the reflective surface of the long mirror 51a and the reflective surface of the long mirror 51b should be corrected. Such correction is based on the output from the range-measuring interferometer MY (specifically the output from the photodetector 48a), the output from the range-measuring interferometer PY (specifically the output from the photodetector 48b), and the output from the differential interferometer C (specifically the output from the photodetector 64). The distance between the reflective surfaces of the two long mirrors 51a and 51b is perpendicular to the scanning direction while any fluctuation generally occurs in the scanning direction. Determining a correcting amount is equivalent to measuring a flatness deviation $\Delta y_j$ that can be caused by, e.g., bend or distortion between the between the first reference surface and the second reference surface. The correction unit 80d determines a correcting amount in the scanning direction corresponding to a displacement quantified in the output of the range-measuring interferometer X0.

When the pattern on the mask 101 is transferred onto the photosensitive substrate 102 by a projection-exposure step, the carriage control unit 80b moves the carriage 76 in the scanning direction via the carriage drive system 81. This is done while monitoring a position, a displacement, or a scanning speed of the substrate 102 based on an output from the range-measuring interferometer X0. The calculation unit 80a determines any needed corrections ($\Delta X$, $\Delta Y$, $\Delta \theta$) for correcting relative deviations of the mask 101 with respect to the substrate 102, based on the outputs from the interferometers X1, X2, MY, PY and on the output from the correction unit 80d.

More specifically, the calculation unit 80a calculates a relative deviation (first correction) $\Delta X$ of the mask 101 in the x direction relative to the substrate 102 according to Equation (4) and based on respective outputs from the two differential interferometers X1, X2.

$$\Delta X = (x_1 + x_2)/2 \qquad (4)$$

wherein $x_1$ is an observed value obtained with the interferometer X1, and $x_2$ is an observed value obtained with the interferometer X2.

The calculation unit 80a also calculates a relative deviation (second correction) $\Delta Y$ of the mask 101 in the y direction relative to the substrate 102 according to Equation (5) and based on respective outputs from the two range-measuring interferometers MY, PY.

$$\Delta Y = M_y - P_y - \Delta y_j \qquad (5)$$

wherein $M_y$ is an observed value obtained with the interferometer MY, $P_y$ is an observed value obtained with the interferometer PY, and $\Delta y_j$ is a correction determined by the correction unit 80d.

The calculation unit 80a calculates a relative rotation (third correction) $\Delta \theta$ of the mask 101 about the z direction relative to the substrate 102 according to Equation (6) based on respective outputs from the two differential interferometers X1, X2.

$$\Delta \theta = (x_1 - x_2)/D \qquad (6)$$

wherein D is a distance between measurement optical paths of the two differential interferometers X1, X2, or a distance between measurement points of the two differential interferometers X1, X2, as shown in FIG. 6.

The stage control unit 80c drives the drive system (adjustment system) including the actuators 77 and 78 as shown in FIG. 11 so that the values $\Delta X$, $\Delta Y$, $\Delta \theta$ obtained by the calculation unit 80a become zero or reach a predetermined value. Thus, the relative positional displacement of the mask 101 relative to the plate 102 is corrected. In other words, based on the output from the calculation unit 80a, the stage control unit 80c controls the drive system (adjustment system) including the actuators 77 and 78 as shown in FIG. 11 to move the mask stage 72 so that a positional displacement of the mask 101 relative to the substrate 102 becomes zero.

The mask pattern is thus transferred and exposed onto the substrate 102 while any relative positional displacement between the mask 101 and substrate 102 is corrected. During the exposure, the mask 101 is illuminated by the illumination optical system 71, while the mask 101 and the substrate 102 are moved together as one body by the carriage drive system 81 in the scanning direction (x direction) relative to the projection optical system 1. Such a scheme produces an excellent pattern image of the mask 101 on the photosensitive substrate 102j. As a result, a high-quality device (e.g., display device or semiconductor device) can be produced by photolithography.

Any rotational displacement about the z-axis, and any positional displacement in the x and y directions between the substrate 102 and the mask 101 can be corrected by rotating and moving the substrate stage 75 about the z axis and along the x and y axes, respectively. Alternatively, both the mask stage 72 and the substrate stage 75 can be rotated about the z axis and move in the x and y directions.

It is preferable to use a stage control unit 80c to control rotation and movement of the substrate stage 75 (or both the substrate stage 75 and mask stage 72) about the z axis and in the x and y directions, respectively.

A preferred embodiment of an interferometer as used in the second example embodiment of an exposure apparatus is shown in FIG. 7. A laser beam emitted from a laser light source S is reflected by a beam splitter 2 and directed toward differential interferometers X1 and X2. Since the differential interferometers X1 and X2 have the same structure, as is shown in FIG. 7, the structure of the differential interferometer X1 is described below in detail while reference numerals for corresponding components of the differential interferometer X2 are noted in parentheses.

The laser beam reflected by the beam splitter 2 is split into two beams by a polarization half prism 21 (31). The beam that has passed through the polarization half prism 21 (31) strikes, after passing through a quarter-wavelength plate 22a (32a), a corner cube 23a (33a) mounted on the mask stage. The beam reflected by the corner cube 23a (33a) is reflected by a fixed mirror 24a (34a) and returns to the corner cube 23a (33a). The beam reflected again by the corner cube 23a (33a) returns to the polarization half prism 21 (31) through the quarter-wavelength plate 22a (32a).

The beam reflected by the polarization half prism 21 (31) enters, through a quarter-wavelength plate 22b (32b), a corner cube 23b (33b) mounted to the substrate stage. The beam reflected by the corner cube 23b (33b) is reflected by a fixed mirror 24b (34b) and returns to the corner cube 23b (33b). The beam reflected again by the corner cube 23b (33b) returns to the polarization half prism 21 (31) through the quarterwave plate 22b (32b). The two beams returning to the polarization half prism 21 (31) interfere with each other, and a resulting interference beam is generated and directed to the photodetector 25 (35).

The differential interferometer X1 measures a relative displacement in the x direction between the mask 101 and the substrate 102 based on the output from the photodetector 25. Similarly, the differential interferometer X2 measures a relative displacement in the x direction between the mask 101 and the substrate 102 based on the output from the photodetector 35. The differential interferometers X1 and X2 separated from each other by a predetermined distance in the y direction. Outputs from the two differential interferometers X1 and X2 are input to the calculation unit 80a as shown in FIG. 11. The calculation unit 80a determines a relative positional displacement $\Delta X$ between the mask 101 and the substrate 102 in the x direction, and a relative rotational displacement $\Delta \theta$ between the mask 101 and the substrate 102 about the z axis. The stage control unit 80c can correct these displacements of the mask 101 relative to the substrate 102 by means of a drive system comprising actuators 77 and 78 shown in FIG. 11 such that the calculated values (ΔX, Δθ) determined by the calculation unit 80a become zero or reach a predetermined value.

Whenever the mask 101 and the substrate 102 move in the x direction and the y direction, or rotate about the z axis, the corner cubes 23a, 23b, 33a, 33b also move or rotate, respectively. The incidence angle of the interference beam entering the photodetectors 25 and 35 is constant because of the characteristics of the corner cube. However, if the corner cubes 23a, 23b, 33a, 33b shift in the y direction by δ, then the incidence position of the beam on the fixed mirrors 24a, 24b, 34a, 34b shift in the y direction by the distance 2A. Using the differential interferometers to measure a relative displacement between the mask 101 and the substrate 102 is equivalent to measuring positions of vertices of the corner cubes 23a, 23b, 33a, 33b. Therefore, it is preferable to place the vertex of each corner cube on the same plane as the plane of the patter defined by the mask 101 or the plane of the substrate 102 that is exposed in order to reduce the so-called Abbe error.

As shown in FIG. 7, the laser beam emitted from the laser light source S reaches the range-measuring interferometer X0 after the beam passes through the beam splitter 2 and is reflected by a beam splitter 3.

The beam reflected by the beam splitter 3 is split into two beams by the polarization half prism 11. The beam passing through the polarization half prism 11 reaches, through a quarter-wavelength plate 12a, a corner cube 13a mounted to the projection optical system 1. The beam reflected by the corner cube 13a is reflected by a fixed mirror 14a and returns to the corner cube 13a. The beam reflected again by the corner cube 13a returns to the polarization half prism 11 through the quarter-wavelength plate 12a.

On the other hand, the beam reflected by the polarization half prism 11 strikes a corner cube 13b secured on the plate stage for holding the plate 102 through the quarter wavelength plate 12b. The beam reflected by the corner cube 13b is further reflected by a fixed mirror 14b, and in turn returns to the corner cube 13b. The beam reflected again by the corner cube 13b returns to the polarization half prism 11 through the quarter-wave plate 12b. The two beams returning to the polarization half prism 11 interfere with each other to produce an interference beam that is directed to the photo-detector 15.

The range-measuring interferometer X0 can measure a displacement of the substrate 102 in the x direction relative to the projection optical system 1 based on an output from the photodetector 15. As a result, the carriage control unit 80b (FIG. 11) can control the carriage control system 81 while monitoring a position, a displacement, and a scanning speed of the substrate 102 in the scanning direction (x direction).

In order to reduce measurement errors involved in rotation of the plate 102 about the z axis in the range-measuring interferometer X0, the corner cube 13b is preferably positioned near the center of the plate 102 along the y direction. To reduce Abbe error in the range-measuring interferometer X0, it is preferable to position the vertex of each corner cube within the same plane as the exposed plane of the plate.

The laser beam emitted from the laser light source S is further split into two beams by a beam splitter 4 after the beam passes through the beam splitters 2 and 3, as shown in FIG. 7. The beam reflected by the beam splitter 4 reaches the range-measuring interferometer MY, and the beam passing through the beam splitter 4 reaches the range-measuring interferometer PY. Since the range-measuring interferometers MY and PY have the same structure, as shown in FIG. 7, the structure of the range-measuring interferometer MY is detailed below and reference numerals for corresponding components of the range-measuring interferometer PY are noted in parentheses.

The laser beam reflected by the beam splitter 4 is split into two beams by a polarization half prism 41a (41b). The beam reflected by the polarization half prism 41a (41b) passes through a quarter-wavelength plate 42a (42b) to a reflection surface of a long mirror 51a (51b) mounted on the projection optical system 1. The long mirror 51a (51b) provides a reference surface. The reflection surface of the long mirror 51a (51b) is parallel to the x-z plane and generally extends in the x direction. The beam reflected by the reflection surface of the long mirror 51a (51b) passes through the quarter-wavelength plate 42a (42b) to the polarization half prism 41a (41b). After passing through the polarization half prism 41a (41b) the beam reaches a corner cube 43a mounted on the mask stage (a corner cube 43b is mounted on the substrate stage). The beam reflected by the corner cube 43a (43b) returns to the polarization half prism 41a (41b).

The beam that has passed through the polarization half prism 41a (41b) passes through a quarter-wavelength plate 44a (44b) to a fixed mirror 45a (45b). The beam reflected by the fixed mirror 45a (45b) returns to the polarization half prism 41a (41b) through the quarter-wavelength plate 44a (44b). The beam reflected by the polarization half prism 41a (41b) propagates toward the corner cube 43a mounted on the mask stage (the corner cube 43b is mounted on the substrate stage). The beam is reflected by the corner cube 43a (43b), and returns to the polarization half prism 41a (41b).

The two beams returning to the polarization half prism 41a (41b) interfere with each other and produce an interference beam. The interference beam is directed to the photodetector 48a (48b) through a beam reduction optical system which includes a pair of lens elements 46a (46b) and 47a (47b).

Thus, the range-measuring interferometer MY measures a displacement, in the y direction, of the mask 101 relative to the projection optical system 1 based on the output from the photodetector 48a. Similarly, the range-measuring interferometer PY measures a displacement, along the y direction, of the plate 102 relative to the projection optical system 1 based on the output from the photodetector 48b.

In order to reduce measurement errors arising from rotation of the mask 101 or the substrate 102 about the z axis in the range-measuring interferometers MY and PY, the corner cubes 43a and 43b are preferably positioned near the center of the mask 101 and the plate 102 in the x direction, respectively.

To reduce Abbe error in the range-measuring interferometers MY and PY, it is preferable to place the vertex of each corner cube within the same plane as the pattern plane of the mask 101 or the photosensitive surface of the substrate 102.

Figure 8:
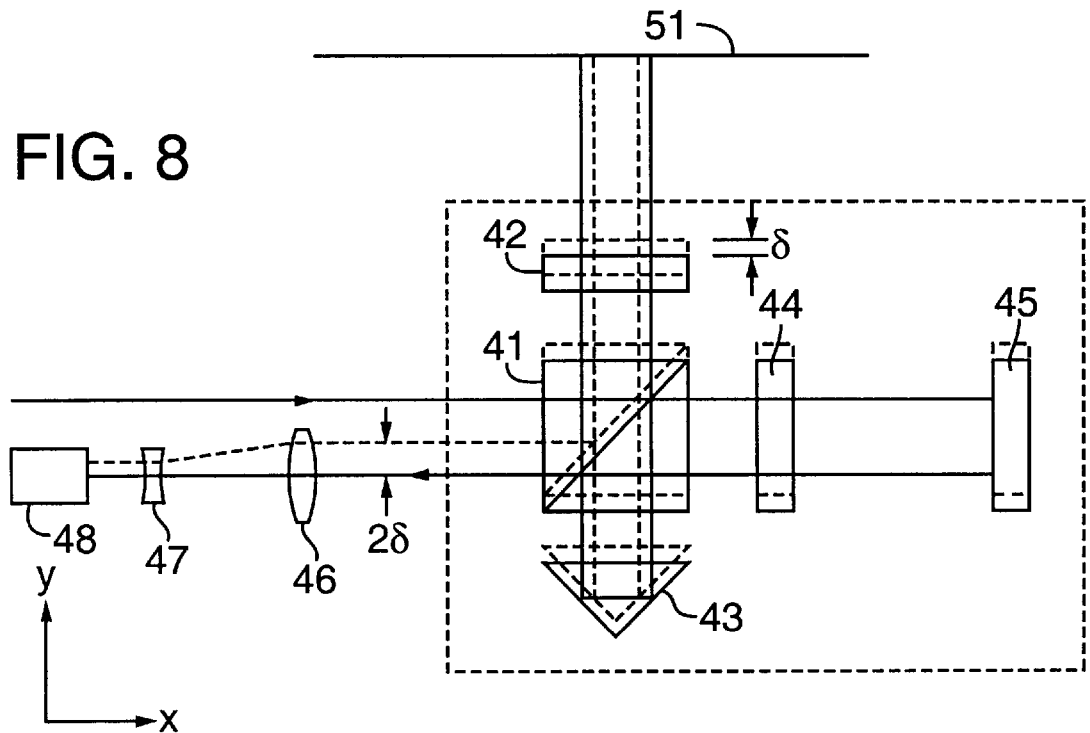
FIG. 8 illustrates the measuring interferometer MY (PY) shown in FIG. 7, particularly depicting the function of the beam reductive optical system.

FIG. 8 is a partial plan view of a beam-reduction system 46, 47 used in the range-measuring interferometer MY (PY) of FIG. 7. In FIG. 8, the two range-measuring interferometers MY and PY are shown without using the suffix a or b.

The rectangular region enclosed by the dashed line are attached integrally with the mask stage or the substrate stage. In the range-measuring interferometer MY (PY), the polarization half prism 41, the quarter-wavelength plate 42, the quarter-wavelength plate 44, and the fixed mirror 45 are moved together with the mask 101 (the substrate 102).

Movement of the mask 101 (the substrate 102) a distance δ in the +y direction results in corresponding movement of the polarization half prism 41, the quarter-wavelength plate 42, the quarter-wavelength plate 44, and the fixed mirror 45 by the distance 6 in the +y direction, as indicated by the dashed lines in FIG. 8. As a result, the interference beam emitted from the polarization half prism 41 moves a distance 26 in the +y direction. However, a beam reduction optical system 46, 47 serving as a beam-deviation correcting system is situated in the optical path between the polarization half prism 41 and the photodetector 48. This arrangement makes it possible to suppress a positional deviation of the interference beam to below a predetermined level corresponding to the magnification of the beam reduction optical system 46, 47. Because the magnification of the beam reduction optical system 46, 47 is set to an appropriate level, the photodetector 48 that receives the interference beam can reliably measure a displacement even if the displacement of the mask 101 (the substrate 102) in the +y direction is large.

Figure 9:
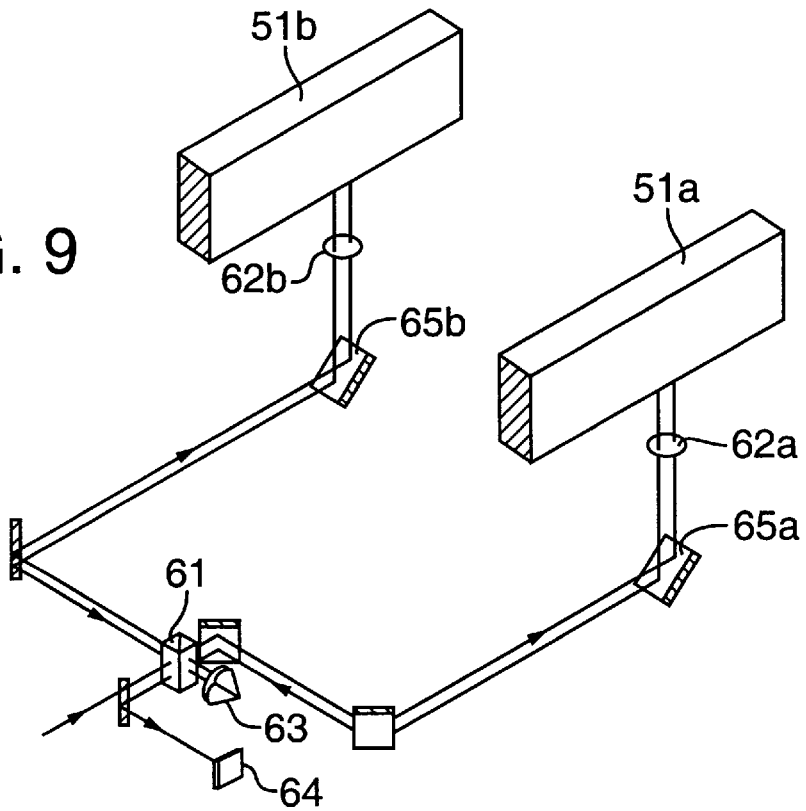
FIG. 9 illustrates the interior structure of the differential interferometer C shown in FIG. 7.

Referring back to FIG. 7, the laser beam emitted from the laser light source S is reflected by the beam splitter 2 and guided to the differential interferometer C. FIG. 9 is an enlarged perspective view of the inner configuration of the differential interferometer C of FIG. 7.

As shown in FIG. 9, the laser beam entering the differential interferometer C is split into two beams by a polarization half prism 61. The beam passing through the polarization half prism 61 strikes a reflection surface (reference surface) of a long mirror 51a via a mirror 65a and a quarter-wavelength plate 62a that are mounted to the mask stage. The beam reflecting from the reflection surface of the long mirror 51a passes through the quarter-wavelength plate 62a and the polarization half prism 61, and strikes a corner cube 63. The beam is reflected by the corner cube 63, and returns to the reflection surface of the long mirror 51a through the polarization half prism 61 and the quarter-wavelength plate 62a. The beam is again reflected by the reflection surface of the long mirror 51a, and returns to the polarization half prism 61 through the quarter-wavelength plate 62a.

The beam reflected by the polarization half prism 61 reflects from a mirror 65b and passes through a quarter-wavelength plate 62b to a reflection surface (reference surface) of a long mirror 51b. The mirror 65b and quarter-wavelength plate 62b are mounted to the substrate stage. The beam reflected by the reflection surface of the long mirror 51b returns through the quarter-wavelength plate 62b and the polarization half prism 61 to strike the corner cube 63. The beam is reflected by the corner cube 63 and returns to the reflection surface of the long mirror 51b through the polarization half prism 61 and the quarter-wavelength plate 62b. The beam is again reflected by the reflection surface of the long mirror 51b, and returns to the polarization half prism 61 through the quarter-wavelength plate 62b.

The two beams returning to the polarization half prism 61 interfere with each other, and produce an interference beam. The interference bean is directed to the photodetector 64. Thus, the differential interferometer C can measure a difference between a distance from the reflection surface of the long mirror 51a (serving as a first reference surface) to the mask 101 in the y direction and a distance from the reflection surface of the long mirror 51b (serving as a second reference surface) to the substrate 102 in the y direction, based on the output from the photodetector 64.

In the differential interferometer C, deviations of the interference beam rarely arise even if the mask 101 and the substrate 102 move. Therefore, the differential interferometer C does not require a beam-reduction optical system as shown in FIG. 8.

Figure 10:
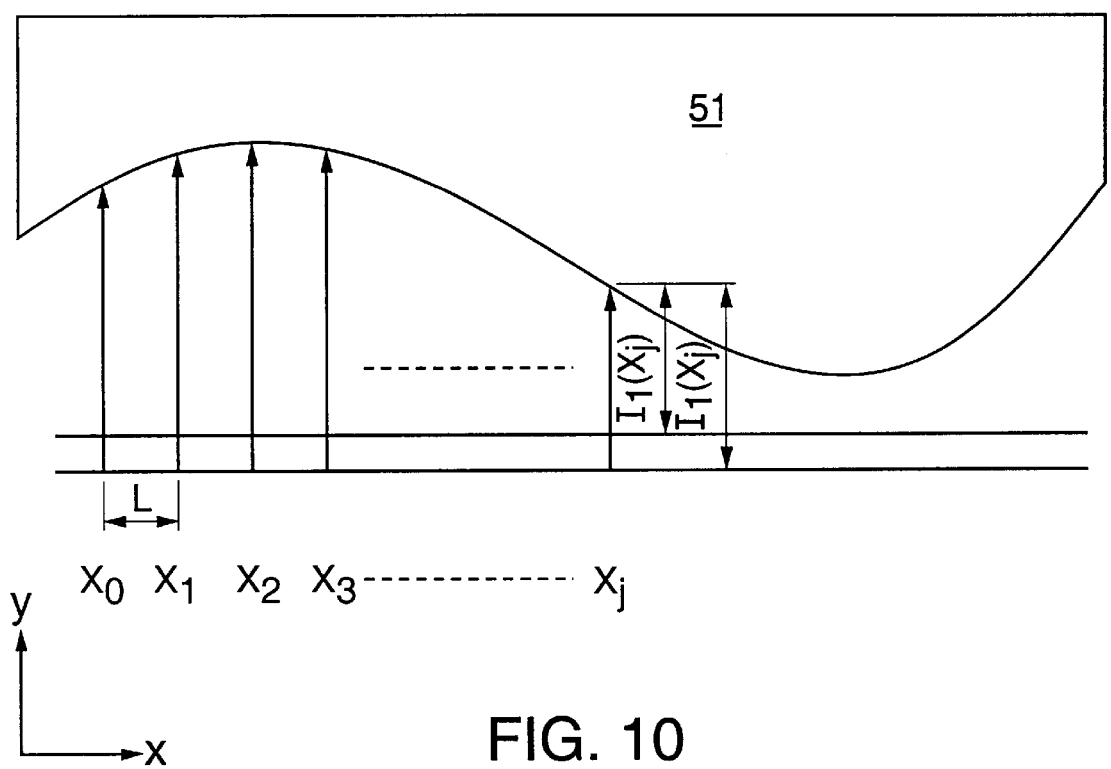
FIG. 10 is a diagram used for explaining how a bend of the long mirror is corrected.

FIG. 10 is a diagram for explaining how a bend of the long mirror can be corrected. It is impossible for a single interferometer (e.g., a range-measuring interferometer) to distinguish a bend or warp of the reflection surface of the long mirror 51 from a positional shift of the stage in the y direction. However, if a bending cycle of the long mirror 51 in the x direction is sufficiently longer than the distance L between a pair of interferometers arranged along the x direction, then the bending condition of the reflective surface of the long mirror 51 can be estimated by successively summing up a difference between two outputs from the two interferometers.

The distance between the pair of interferometers arranged along the x direction is denoted L. An output of a first interferometer located at $x=x_i$ is denoted $I_1(x_i)$, and an output of a second interferometer located at $x=x_{i-1}$ is denoted $I_2(x_{i-1})$ The following equations apply:

$$x_i = x_0 + iL \ (i=0, 1, 2 \ldots) \qquad (7)$$

$$\Delta I_i = I_1(x_i) - I_2(x_{i-1}) \qquad (8)$$

where $\Delta I_i$ is a difference between two outputs from the pair of interferometers, the first being located at $x=x_i$ and the second being located at $x=x_{i-1}$.

In $\Delta I_i$ of Equation (8), an influence of a positional shift of the stage is canceled out. However, since there is an offset between the positions of the two interferometers, the difference $\Delta I_i$ does not always represent an inclination of the reflective surface of the long mirror 51.

In the context of the foregoing, the inclination means a change in the position of the reflective surface along the y direction between $x=x_i$ and $x=x_{i-1}$. When the y-position of the reflection surface at $x=x_0$ is taken as a reference position, then any change $\Delta y_j$ of the reflection surface along the y direction at $x=x_j$ is obtained by subtracting an offset between the interferometers from the difference $\Delta I_i$ of equation (8). If $\Delta I_0$ at $x=x_0$ is subtracted as the offset from the difference $\Delta I_i$ of equation (8), then the change $\Delta y_j$ represents a deviation or change in inclination of the relative surface between $x=x_{-1}$ and $x=x_0$. This is expressed by the following equation.

$$\Delta y_j = \Sigma(\Delta I_j - \Delta I_0) \qquad (9)$$

wherein i=1 through j. If $(\Delta I_j - \Delta I_0)$ remains zero with respect to i=1 through j, then the reflection surface of the long mirror 51 is regarded as being linear. The slope of the long mirror 51 equals the inclination of the reflection surface of the long mirror 51 between $x=x_{-1}$ and $x=x_0$. If $(\Delta I_j - \Delta I_0)$ is a constant (other than zero) with respect to i=1 through j, the reflection surface of the long mirror 51 is also regarded as having a linear shape.

The following is a description of how a bend in one or both the long mirrors is corrected. First considered is a specific condition in which the two long mirrors 51a and 51b are arranged so that one reflective surface is completely parallel to the other reflective surface. The two reflective surfaces can be overlapped with each other by a parallel displacement along the z direction and the y direction. The mask 101 and the substrate 102 are assumed to be completely aligned. To maintain the positional relationship between the mask 101 and the substrate 102 constant in the y direction under this condition, position control is simply performed so that a difference between the outputs from the two range-measuring interferometers MY and PY is constant. Because the projection optical system is designed to form an erect image at a magnification ratio of one, the transfer accuracy of the apparatus is not adversely affected even if the two reflective surfaces of the long mirrors 51a and 51b bend, so long as the mask 101 and the substrate 102 move together in the y direction to follow the bend of the reflective surfaces of the long mirrors 51a and 51b. If the two reflective surfaces are arranged to be perfectly parallel to each other, then the output of the differential interferometer C is maintained constant throughout the entire scan.

Next considered is a condition in which the reflective surfaces of the two long mirrors 51a and 51b are completely planar, but nevertheless are skewed about the z axis and are thus not parallel to each other. In other words, the angle between the reflective surface of the long mirror 51a and the x-z plane is assumed to be different from the angle between the reflective surface of the long mirror 51b and the x-z plane. Under this condition, it is sufficient to correct a change in the distance between the two reflective surfaces along the y direction throughout the scan.

Generally, any change in the distance between the two reflective surfaces in the y direction is corrected at any of various scanning points. A bend component that should be corrected is estimated from Equations (7)–(9), taking into account a difference between the differential of outputs from the pair of range-measuring interferometers MY and PY and an output from the differential interferometer C.

For example, a distance from the differential interferometer C to the pair of range-measuring interferometers MY and PY in the x direction is denoted L. An output of the range-measuring interferometer MY at $x=x_i$ is denoted $I_M(x_i)$, an output of the range-measuring interferometer PY at $x=x_i$ is denoted $I_p(x_{i-1})$, and an output of the differential interferometer C at $x=x_{i-1}$ is denoted $I_c(x_{i-1})$. The following Equations (10) and (11) apply:

$$x_i = x_0 + iL \quad (i=0, 1, 2 \ldots) \tag{10}$$

$$\Delta I_i = [I_M(x_i) - I_p(x_i)] - I_c(x_{i-1}) \tag{11}$$

$[I_M(x_i) - I_p(x_i)]$ of Equation (11) corresponds to $I_1(x_i)$ of Equation (8), and $I_C(x_{i-1})$ of Equation (11) corresponds to $I_2(x_{i-1})$ of Equation (8).

Similar to Equation (9), a deviation (i.e., correcting amount) $\Delta y_j$ caused only by a bend of the reflection surface at $x=x_j$ is expressed in Equation (12), below, using a change in the displacements of the two reflective surfaces in the y direction at $x=_{-1}$ and $x=x_0$ as a reference.

$$\Delta y_j = \Sigma(\Delta I_j - \Delta I_0)(\Sigma: i=1 \text{ through } j) \tag{12}$$

During scanning exposure of the substrate, position control is performed such that $\Delta y_j$ of Equation (12) is held constant while maintaining alignment of the mask 101 and the substrate 102.

Next, position control for maintaining the alignment state of the mask 101 and the substrate 102 is described. Prior to actual projection and exposure of the mask pattern onto the photosensitive substrate 102, the correction unit 80d shown in FIG. 11 determines any flatness deviations. This determination is made by the range-measuring interferometers MY, PY and the differential interferometer C. Flatness deviations, if present, mainly arise from bends or distortions of the reflective surface of the long mirror 51a (the first reference surface) and the reflective surface of the long mirror 51b (the second reference surface). The correction unit 80d determines a deviation in the scanning direction (x direction) while monitoring a corresponding change in the output of the range-measuring interferometer X0.

The calculation unit 80a shown in FIG. 11 corrects outputs (detection signals $M_y$, $P_y y$) from the two range-measuring interferometers MY, PY representing a deviation, using a correction signal from the correction unit 80d. More specifically, the calculation unit 80a calculates a relative positional displacement $\Delta y$ in the y direction of the mask 101 relative to the substrate 102 based on detection signals from the two range-measuring interferometers (MY, PY) and the correction signal ($\Delta y_j$) from the correction unit 80d. (Equation 5). Thus, the stage control unit 80c actuates the driving system (the actuators 77, 78 in FIG. 6) in such a way that the calculated $\Delta y$ becomes zero, thereby correcting the positional deviation of the mask 101 relative to the substrate 102.

As described above, a correction for errors due to a bend in the long mirrors 51a, 51b is determined prior to carrying out a projection exposure. During projection exposure, the influence of any errors due to a bend of the long mirrors 51a, 51b or the like is corrected based on the determined amount of needed correction. Linear offset and rotational offset of the mask 101 and substrate 102 relative to each other are corrected in the scanning direction with high precision while correcting any positional shift between the mask 101 and the substrate 102 in the direction perpendicular to the scanning direction. Even if the mask 101 and the substrate 102 are moved together as one body with respect to the projection optical system 1 during the projection exposure, an excellent projection image can be produced on the entire exposure region of the photo-sensitive substrate 102. As a result, a high-quality device (e.g., a display device such as a liquid crystal device or a plasma display device; or a semiconductor device such as an LSI, a thin film magnetic head, an image pickup device, such as a CCD, or the like) can be produced.

As described above, according to the present invention, not only a positional deviation and a rotational deviation in the scanning direction can be controlled, but also positional deviations in a direction perpendicular to the scanning direction. Such positional deviations arising between the mask and substrate can be controlled by correcting the effects of bending of the reference surfaces. Again, this results in production of an excellent projected image over the entire exposure region of the photosensitive substrate during the scanning exposure. Also, when the reflective surfaces of the two long mirrors mounted to the projection optical system are used as the two reference surfaces, transfer accuracy can be maintained without having to enhance the flatness (surface precision) of the reflective surfaces of the long mirrors.

Whereas the invention has been described by way of example embodiments, it will be understood that the words which have been used herein are words of description, rather than words of limitation. Modifications and changes to the embodiments can be made, within the purview of the appended claims, without departing from the spirit and scope of the invention in its broader aspects. Although the invention has been described herein with reference to particular structures, components, means, materials, and embodiments, it will be understood that the invention is not limited to the particulars disclosed. The invention extends to all equivalent structures, components, means, and uses such as are properly within the scope of the appended claims.

What is claimed is:

1. An exposure apparatus comprising:
   (a) an illumination optical system for illuminating a mask defining a pattern;
   (b) a projection optical system for forming an erect image of the pattern on a substrate, the mask and substrate being movable together in a prescribed scanning direction relative to the projection optical system to expose and transfer the pattern onto the substrate;

(c) a first relative-displacement measuring system for measuring a displacement of the mask relative to the substrate in the scanning direction;

(d) a second relative-displacement measuring system, separate from the first relative-displacement measuring system with a predetermined space between the first and second relative-displacement measuring systems in a direction perpendicular to the scanning direction, for measuring a displacement of the mask relative to the substrate in the scanning direction;

(e) a first detection system for detecting a displacement of the mask, in the direction perpendicular to the scanning direction, from a first reference surface separate from the mask and extending in the scanning direction;

(f) a second detection system for detecting a displacement of the substrate, in the direction perpendicular to the scanning direction, from a second reference surface separate from the substrate and extending in the scanning direction;

(g) a position adjustment system for adjusting the position of at least one of the mask and substrate;

(h) a calculation system for calculating a position-adjusting amount based on outputs from the first and second relative-displacement measuring systems and on outputs from the first and second detection systems; and (i) a control system for controlling the position adjustment system based on an output from the calculation system.

2. The exposure apparatus of claim 1, further comprising a first reference member including the first reference surface, and a second reference member including the second reference surface, wherein the first detection system detects displacement of the mask in a direction perpendicular to the scanning direction based on a displacement of the mask relative to the first reference surface; and the second detection system detects displacement of the substrate in the direction perpendicular to the scanning direction based on a displacement of the substrate relative to the second reference surface.

3. The exposure apparatus of claim 1, further comprising:
a driving system for moving the mask and substrate together relative to the projection optical system in the scanning direction to expose and transfer the pattern defined by the mask onto the substrate;
a third detection system for detecting a displacement, in the scanning direction, of the mask or substrate relative to the projection optical system; and
a second control system for controlling the driving system based on an output from the third measuring system.

4. The exposure apparatus of claim 3, further comprising a mask stage and a substrate stage, wherein each of the first, second, and third detection systems comprises a range-measuring interferometer, each range-measuring interferometer comprising a corner reflector mounted to the mask stage or the substrate stage, each corner reflector having a vertex situated in a plane defined by the mask or substrate, respectively, held in the mask stage or substrate stage, respectively, to which the corner reflector is mounted.

5. The exposure apparatus of claim 1, further comprising a mask stage and a substrate stage, wherein each of the first and second relative-displacement measuring systems comprises a differential interferometer comprising a first corner reflector mounted to the mask stage and a second corner reflector mounted to the substrate stage, the first corner reflector including an apex situated in a plane defined by the mask held in the mask stage, and the second corner reflector including an apex situated in a plane defined by the substrate held in the substrate stage.

6. The exposure apparatus of claim 2, further comprising a source of a light beam, and wherein each of the first and second detection systems comprises:
a corner reflector mounted to the mask stage or the substrate stage, the corner reflector serving as a moving mirror;
a beam splitter for splitting the light beam into a reference beam directed to the respective reference member and a detection beam directed to the corner reflector;
a photodetector for receiving an interference beam produced by interference of the reference beam received from the reference member with the detection beam received from the corner reflector; and
a beam-fluctuation correcting unit for correcting any fluctuation in the interference beam caused by a displacement of the respective mask or substrate in a direction perpendicular to the scanning direction.

7. The exposure apparatus of claim 1, wherein the projection optical system comprises multiple projection optical units for forming an erect image of the pattern defined by the mask on a surface of the substrate at a magnification ratio of one.

8. A method for forming a pattern, as defined by a mask, on a substrate using an exposure apparatus as recited in claim 1, the method comprising the steps:
(a) causing the control system to control the position adjustment system based on respective outputs from the first and second relative-displacement measuring systems and on outputs from the first and second detection systems; and
(b) moving the mask and substrate together in a prescribed scanning direction with respect to the projection optical system to expose and transfer the pattern defined by the mask onto the substrate.

9. An exposure apparatus comprising:
(a) an illumination optical system for illuminating a mask defining a pattern;
(b) a projection optical system for forming an erect image of the pattern onto a substrate at a magnification ratio of one, the mask and substrate being moved together in a prescribed scanning direction to expose and transfer the pattern onto the substrate;
(c) a first relative-displacement measuring system for measuring a displacement of the mask relative to the substrate in the scanning direction;
(d) a second relative-displacement measuring system, positioned apart from the first relative-displacement measuring system with a predetermined space therebetween in a direction perpendicular to the scanning direction, for measuring a displacement of the mask relative to the substrate in the scanning direction;
(e) a first detection system for detecting a displacement of the mask along the direction perpendicular to the scanning direction from a first reference surface extending substantially parallel to the scanning direction;
(f) a second detection system for detecting a displacement of the substrate along the direction perpendicular to the scanning direction from a second reference surface extending substantially parallel to the scanning direction;
(g) a third relative-displacement measuring system for measuring a difference between a distance from the first reference surface to the mask along the direction perpendicular to the scanning direction and a distance from the second reference surface to the substrate along the direction perpendicular to the scanning direction;

(h) a correction system for determining a correction amount for correcting an influence of a fluctuation in a distance between the first reference surface and the second reference surface along the direction perpendicular to the scanning direction, the fluctuation occurring along the scanning direction;

(i) a position adjustment system for adjusting the positions of at least one of the mask and substrate;

(j) a calculation system for calculating a position-adjusting amount based on outputs from the first and second relative-displacement measuring systems, outputs from the first and second detection systems, and an output from the correction system; and (k) a control system for controlling the position adjustment system based on an output from the calculation system.

10. The exposure apparatus of claim 9, further comprising:

a driving system for moving the mask and substrate together relative to the projection optical system along the prescribed scanning direction to expose and transfer the pattern of the mask onto the substrate;

a third detection system for detection a displacement of the mask or substrate in the scanning direction relative to the projection optical system; and a second control system for controlling the driving system based on an output from the third measuring system.

11. The exposure apparatus of claim 9, wherein the first and second reference surfaces comprise respective reflective surfaces of separate respective long mirrors mounted to the projection optical system.

12. The exposure apparatus of claim 9, further comprising a mask stage and a substrate stage, and wherein the third relative-displacement measuring system comprises a differential interferometer, the exposure apparatus further comprising:

a first beam splitter for splitting a light beam, emitted from a light source, into a first beam directed to the first reference surface and a second beam directed to the second reference surface; and a first photodetector for receiving an interference beam produced by interference of the first beam reflected from the first reference surface by a reflective member mounted to the mask stage and the second beam reflected from the second reference surface by a reflective member mounted to the substrate stage.

13. The exposure apparatus of claim 10, wherein each of the first, second and third detection systems comprises a range-measuring interferometer each including a corner reflector mounted to the mask stage or the substrate stage, each corner reflector having a vertex situated within a plane defined by the mask or substrate held by the mask stage or substrate stage, respectively, to which the corner reflector is mounted.

14. The exposure apparatus of claim 9, further comprising a mask stage for holding the mask and a substrate stage for holding the substrate, wherein each of the first and second relative-displacement measuring systems comprises a differential interferometer including a first corner reflector mounted to the mask stage, and a second corner reflector mounted to the substrate stage, respectively, the first corner reflector having an apex situated substantially within a pattern plane of the mask as the mask is held in the mask stage, and the second corner reflector having an apex situated substantially within a plane defined by the substrate on which the image is exposed.

15. The exposure apparatus according to claim 9, further comprising a mask stage for holding the mask and a substrate stage for holding the substrate, wherein each of the first and second detection systems comprises:

a fixed mirror mounted to the projection optical system;

a corner reflector fixed to a respective stage, the corner reflector serving as a moving mirror;

a second beam splitter for splitting a beam emitted from a light source into a reference beam directed to the fixed mirror and a detection beam directed toward the corner reflector;

a second photodetector for receiving an interference beam produced by interference between the reference beam and the detection beam reflected from the corner reflector; and a beam-fluctuation correcting unit for correcting a fluctuation in the interference beam caused by a displacement of the mask or substrate in the direction perpendicular to the scanning direction.

16. The exposure apparatus of claim 9, wherein the projection optical system comprises a plurality of projection optical units for forming an erect image of the pattern onto the substrate at a magnification ratio of one.

(a) causing the control system to control the position adjustment system based on respective outputs from the first and second relative-displacement measuring systems and on outputs from the first and second detection systems; and (b) moving the mask and substrate together in a prescribed scanning direction with respect to the projection optical system to expose and transfer the pattern defined by the mask onto the substrate.

17. A method for forming a pattern, as defined by a mask, on a substrate using an exposure apparatus as recited in claim 9, the method comprising the steps:

(a) calculating a correction amount for correcting an influence of a fluctuation in the distance between the first reference surface and the second reference surface in the scanning direction based on outputs from the first and second detection systems and an output from the third relative-displacement measuring system, the distance between the first reference surface and the second reference surface being perpendicular to the scanning direction; and (b) moving the mask and substrate together in the scanning direction relative to the projection optical system while causing the control system to control the position adjustment system based on outputs from the first and second relative-displacement measuring systems and an output from the correction system, thereby exposing and transferring the pattern onto the substrate.

18. An exposure apparatus comprising:

(a) an illumination system for illuminating a mask defining a pattern;

(b) a projection system for forming an image of the pattern on a substrate;

(c) a first stage for supporting the mask, the first stage being movable in a scanning direction relative to the projection system;

(d) a second stage for supporting the substrate, the second stage being movable in the scanning direction relative to the projection system;

(e) a first fixed member disposed along the scanning direction for measuring a first displacement of the first stage relative to the first fixed member; and (f) a second fixed member disposed along the scanning direction for measuring a second displacement of the second stage with respect to the second fixed member.

19. The exposure apparatus of claim 18, further comprising a first detection system for detecting the first displacement and a second detection system for detecting the second displacement.

20. The exposure apparatus of claim 18, wherein the projection system comprises multiple projection units.

21. The exposure apparatus of claim 19, further comprising an adjusting system for adjusting at least one of the first displacement and the second displacement.

22. The exposure apparatus of claim 20, further comprising a first detection system for detecting the first displacement and a second detection system for detecting the second displacement.

23. The exposure apparatus of claim 22, further comprising an adjusting system for adjusting at least one of the first placement and the second placement.

24. A method for exposing a pattern, defined by a mask, onto a substrate, the method comprising the steps:

(a) providing an exposure apparatus according to claim 18;

(b) illuminating the mask using the illumination system; and (c) moving the mask and the substrate in the scanning direction relative to the projection system so as to expose an image of the pattern onto the substrate using the projection system.

25. A method for exposing a pattern, defined by a mask, onto a substrate, the method comprising the steps:

(a) providing an exposure apparatus according to claim 19;

(b) illuminating the mask using the illumination system; and (c) moving the mask and the substrate in the scanning direction relative to the projection system so as to expose an image of the pattern onto the substrate using the projection system.

26. A method for exposing a pattern, defined by a mask, onto a substrate, the method comprising the steps:

(a) providing an exposure apparatus according to claim 20;

(b) illuminating the mask using the illumination system; and (c) moving the mask and the substrate in the scanning direction relative to the projection system so as to expose an image of the pattern onto the substrate using the projection system.

27. A method for exposing a pattern, defined by a mask, onto a substrate, the method comprising the steps:

(a) providing an exposure apparatus according to claim 21;

(b) illuminating the mask using the illumination system; and (c) moving the mask and the substrate in the scanning direction relative to the projection system so as to expose an image of the pattern onto the substrate using the projection system.

28. A method for exposing a pattern, defined by a mask, onto a substrate, the method comprising the steps:

(a) providing an exposure apparatus according to claim 22;

(b) illuminating the mask using the illumination system; and (c) moving the mask and the substrate in the scanning direction relative to the projection system so as to expose an image of the pattern onto the substrate using the projection system.

29. A method for exposing a pattern, defined by a mask, onto a substrate, the method comprising the steps:

(a) providing an exposure apparatus according to claim 23;

(b) illuminating the mask using the illumination system; and (c) moving the mask and the substrate in the scanning direction relative to the projection system so as to expose an image of the pattern onto the substrate using the projection system.

30. An exposure apparatus comprising:

(a) an illumination system for illuminating a mask defining a pattern;

(b) a projection system for projecting an image of the pattern onto a substrate;

(c) a first stage for supporting the mask, the first stage being movable in a scanning direction relative to the projection system;

(d) a second stage for supporting the substrate, the second stage being movable in the scanning direction relative to the projection system;

(e) a first fixed area formed along the scanning direction for measuring a first displacement of the first stage;

(f) a second fixed area formed along the scanning direction for measuring a second displacement of the second stage;

(g) a first detection system for detecting the first displacement with respect to the first fixed area; and (h) a second detection system for detecting the second displacement with respect to the second fixed area.

31. The exposure apparatus of claim 30, wherein the projection system comprises multiple projection units.

32. The exposure apparatus of claim 30, further comprising an adjustment system for adjusting at least one of the first displacement and the second displacement.

33. The exposure apparatus of claim 31, further comprising an adjustment system for adjusting at least one of the first placement and the second displacement.

34. A method for exposing a pattern, defined by a mask, onto a substrate, the method comprising the steps:

(a) providing an exposure apparatus according to claim 30;

(b) illuminating the mask using the illumination system; and (c) moving the mask and the substrate in the scanning direction relative to the projection system so as to expose an image of the pattern onto the substrate using the projection system.

35. A method for exposing a pattern, defined by a mask, onto a substrate, the method comprising the steps:

(a) providing an exposure apparatus according to claim 31;

(b) illuminating the mask using the illumination system; and (c) moving the mask and the substrate in the scanning direction relative to the projection system so as to expose an image of the pattern onto the substrate using the projection system.

36. A method for exposing a pattern, defined by a mask, onto a substrate, the method comprising the steps:

(a) providing an exposure apparatus according to claim 32;

(b) illuminating the mask using the illumination system; and (c) moving the mask and the substrate in the scanning direction relative to the projection system so as to expose an image of the pattern onto the substrate using the projection system.

37. A method for exposing a pattern, defined by a mask, onto a substrate, the method comprising the steps:

(a) providing an exposure apparatus according to claim 33;

(b) illuminating the mask using the illumination system; and (c) moving the mask and the substrate in the scanning direction relative to the projection system so as to expose an image of the pattern on the substrate using the projection system.

* * * * *

UNITED STATES PATENT AND TRADEMARK OFFICE
CERTIFICATE OF CORRECTION

PATENT NO.  : 6,049,372

DATED       : April 11, 2000

INVENTOR(S) : Kinya Kato, et al.

Page 1 of 2

It is certified that error appears in the above-identified patent and that said Letters Patent is hereby corrected as shown below:

In Column 3, line 14-16, "The second relative-displacement measuring system is for measuring a displacement of the mask relative to the substrate the scanning direction." should read --The second relative-displacement measuring system is for measuring a displacement of the mask relative to the substrate in the scanning direction.--.

In Column 3, line 47, "detection a" should read --detection of a--.

In Column 6, line 13, "sing" should read --using--.

In Column 6, line 42, "nit 80" should read --unit 80--.

In Column 6, line 44, "in the in the" should read --in the--.

In Column 9, line 23, "5" should read --$\delta$--.

In Column 9, line 61-62, "displacement" should read --displacement,--.

In Column 10, line 31, "43$a$ 43$b$)" should read --43$a$ (43$b$)--.

In Column 12, line 23, "an" should read --and--.

In Column 15, line 4, "between the between the" should read --between the--.

In Column 19, line 6, "26" should read --2$\delta$--.

In Column 19, line 55, "bean" should read --beam--.

In Column 21, line 43, "x=$_{-1}$" should read -- x=x$_{-1}$ --.

In Column 21, line 65, "P$_y^y$)" should read --P$_y$)--.

UNITED STATES PATENT AND TRADEMARK OFFICE
CERTIFICATE OF CORRECTION

PATENT NO.   : 6,049,372

DATED        : April 11, 2000

INVENTOR(S)  : Kinya Kato, et al.

It is certified that error appears in the above-identified patent and that said Letters Patent is hereby corrected as shown below:

In Column 25, line 28, "detection a" should read --detecting a--.

In Column 28, line 46, "placement" should read --displacement--.

Signed and Sealed this

Eighth Day of May, 2001

*Attest:*

NICHOLAS P. GODICI

*Attesting Officer*   Acting Director of the United States Patent and Trademark Office